United States Patent [19]
Sato et al.

[11] Patent Number: 5,262,277
[45] Date of Patent: Nov. 16, 1993

[54] PHOTOSENSITIVE RESIN COMPOSITION AND PHOTOSENSITIVE ELEMENT USING THE SAME

[75] Inventors: Kuniaki Sato; Yasunori Kojima; Shigeo Tachiki; Tohru Kikuchi; Toshiaki Ishimaru; Nobuyuki Hayashi; Mitsumasa Kojima, all of Hitachi, Japan

[73] Assignee: Hitachi Chemical Company, Inc., Japan

[21] Appl. No.: 824,088

[22] Filed: Jan. 22, 1992

Related U.S. Application Data

[63] Continuation of Ser. No. 450,737, Dec. 14, 1989, abandoned.

[30] Foreign Application Priority Data

| Dec. 16, 1988 | [JP] | Japan | 63-318813 |
| Dec. 16, 1988 | [JP] | Japan | 63-318814 |
| Apr. 19, 1989 | [JP] | Japan | 1-099168 |
| May 26, 1989 | [JP] | Japan | 1-134383 |

[51] Int. Cl.$^5$ ............................. G03C 1/725
[52] U.S. Cl. ............................. 430/283; 430/284; 522/96; 522/148
[58] Field of Search ............ 430/283, 284; 522/148, 522/96

[56] References Cited

U.S. PATENT DOCUMENTS

| 4,416,973 | 11/1983 | Goff | 430/281 |
| 4,654,415 | 3/1987 | Ahne et al. | 528/351 |

FOREIGN PATENT DOCUMENTS

| 63-177126 | 7/1988 | Japan | 430/284 |

Primary Examiner—Marion E. McCamish
Assistant Examiner—Mark A. Chapman
Attorney, Agent, or Firm—Antonelli, Terry, Stout & Kraus

[57] ABSTRACT

A photosensitive resin composition comprising (A) a polymer obtained by reacting an isocyanate compound having an ethylenic unsaturated group with a polymer which is a reaction product of a tetracarboxylic acid dianhydride and a diamine, and (B) a photoinitiator, can provide a thick film excellent in heat resistant, adhesiveness, flexibility, electrical and mechanical properties, and is particularly suitable for producing a photosensitive element.

16 Claims, No Drawings

PHOTOSENSITIVE RESIN COMPOSITION AND PHOTOSENSITIVE ELEMENT USING THE SAME

This application is a continuation application of application Ser. No. 450,737, filed Dec. 14, 1989, now abandoned.

BACKGROUND OF THE INVENTION

This invention relates to a photosensitive resin composition and a photosensitive element using the same which are excellent in light-transmitting properties and solubility, can be made into a final cured film having excellent heat resistance, adhesive properties, flexibility, electrical properties and mechanical properties by heat treatment, can be formed into a thick film, have a high photosensitivity also when used in the form of a thick film, and are suitable for use in interlaminar insulating films or surface protective films of multilayer circuit board or semiconductor element, pastes for color filter, etc.

Heat-resistant polymers represented by polyimides are excellent in heat resistance, electrical properties and mechanical properties and hence have heretofore been used in interlaminar insulating films or surface protective films (e.g. α-ray shielding film, passivation film, buffer coat film, etc.) in semiconductor element. They have been widely used also in the field of circuit boards, for example, in resists for forming a circuit pattern on a substrate, or interlaminar insulating films of multilayer circuit board.

In the semiconductor industry, inorganic materials have heretofore been used in interlaminar insulating films and surface protective films, but in recent years, organic materials excellent in heat resistance, such as polyimides, have been used by taking advantage of their characteristics.

A pattern of a surface protective film or interlaminar insulating film of a semiconductor element or multilayer circuit board is formed through troublesome and various steps such as formation of a resist material into a film on the surface of a substrate, exposure of a predetermined portion to light, removal of an unnecessary portion by etching and the like, cleaning of the substrate surface, etc. Therefore, it is desirable to develope a heat-resistant photosensitive material which is such that after forming a pattern by exposure and development, a resist material in a necessary portion can be remained and used as it is as an insulating material.

As such a material, there have been proposed, for example, heat-resistant photosensitive materials obtained by using a photosensitive polyimide, a cyclized polybutadiene or the like as a base polymer. Photosensitive polyimides are particularly noted because of, for example, their excellent heat resistance and easy removal of their impurities.

As such a polyimide, for example, Japanese Patent Publication No. 49-17374 has proposed a system comprising a polyimide precursor and a dichromate, at first. But although this material is advantageous in that it has a practical photosensitivity and a high film-forming ability, it is disadvantageous, for example, in that it is poor in storage stability and that chromium ions remain in polyimide. Therefore, it has not been put into practical use.

Japanese Patent Publication No. 55-100143 and Japanese Patent Appln. Kokai (Laid-Open) No. 60-100143 have proposed processes in which a photosensitive group is given by using an ester linkage or an isocyanate compound, respectively. But the material obtained by the former process has low adhesive properties to a substrate and hence tends to be peeled off, while the material obtained by the latter process has low light-transmitting properties and is difficult to form into a thick film.

SUMMARY OF THE INVENTION

This invention was made in consideration of such problems of prior art and provides a photosensitive resin composition and a photosensitive element using the same which are excellent in light-transmitting properties and solubility, can be made into a final cured film having excellent heat resistance, adhesive properties, flexibility, electrical properties and mechanical properties by heat treatment, can be formed into a thick film, and have a high sensitivity also when used in the form of a thick film.

This invention provides a photosensitive resin composition comprising (A) a polymer containing a repeating unit represented by the general formula:

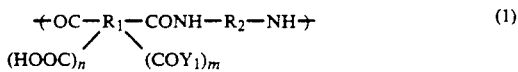

wherein $R_1$ is a tetravalent organic group, $R_2$ is a divalent organic group, at least either $R_1$ or $R_2$ being chosen so that the repeating unit contains at least one silicon atom and/or at least one fluorine atom; $Y_1$ is a monovalent group having an ethylenic unsaturated group; n is zero or 1, m is 1 or 2, n and m being chosen so that $n+m=2$, and (B) a photoinitiator This invention further provides a photosensitive element obtained by laminating said photosensitive resin composition on a substrate.

DESCRIPTION OF THE PREFERRED EMBODIMENTS

According to the present invention, the photosensitive resin composition comprises (A) a polymer containing a repeating unit of the general formula:

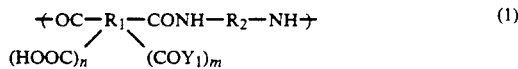

wherein $R_1$ is a tetravalent organic group, $R_2$ is a divalent organic group, at least either $R_1$ or $R_2$ being chosen so that the repeating unit contains at least one silicon atom or/and at least one fluorine atom; $Y_1$ is a monovalent group having an ethylenic unsaturated group; n is zero or 1, m is 1 or 2, n and m being chosen so that $n+m=2$, and (B) a photoinitiator The polymer containing the repeating unit of the general formula (1) can be a polymer containing a repeating unit of the general formula:

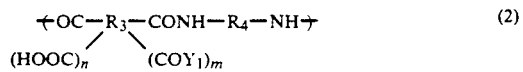

wherein $R_3$ is a tetravalent organic group, $R_4$ is a divalent organic group, at least either $R_3$ or $R_4$ being chosen so that the repeating unit contains at least one silicon atom; $Y_1$ is a monovalent group having an ethylenic unsaturated group; n is zero or 1, m is 1 or 2, n and m being chosen so that $n+m=2$.

The polymer containing the repeating unit of the general formula (1) can also be a polymer containing a repeating unit of the general formula:

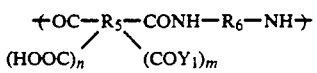
(3)

wherein $R_5$ is a tetravalent organic group, $R_6$ is a divalent organic group, at least either $R_5$ or $R_6$ being chosen so that the repeating unit contains at least one fluorine atom; $Y_1$ is a monovalent group having an ethylenic unsaturated group; n is zero or 1, m is 1 or 2, n and m being chosen so that $n+m=2$.

The polymer containing the repeating unit of the general formula (1) can still be a polymer containing a repeating unit of the general formula:

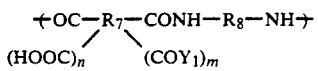
(4)

wherein $R_7$ is a tetravalent organic group, $R_8$ is a divalent organic group, at least either $R_7$ or $R_8$ being chosen so that the repeating unit contains at least one silicon atom and at least one fluorine atom; $Y_1$ is a monovalent group having an ethylenic unsaturated group; n is zero or 1, m is 1 or 2, n and m being chosen so that $n+m=2$.

The polymer containing the repeating unit of the general formula (1) can further be a polymer containing fluorine atoms and siloxane groups which has a repeating unit of the general formula:

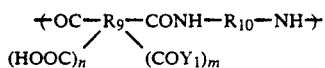
(5)

wherein $R_9$ is a tetravalent aromatic group, a fluorine atom containing tetravalent aromatic group, or a siloxane group containing tetravalent aromatic group, $R_{10}$ is a divalent aromatic group, a fluorine atom containing divalent aromatic group, or a siloxane group containing divalent organic group, $R_9$ and $R_{10}$ being chosen so that the repeating unit necessarily contains at least one fluorine atom and at least one siloxane group; $Y_1$ is a monovalent group having an ethylonic unsaturated group; n is zero or 1, m is 1 or 2, n and m being chosen so that $n+m=2$.

The polymer containing the repeating unit of the general formula (1) can be a photosensitive adduct of an isocyanato compound having at least one ethylenic unsaturated group with a polymer containing a repeating unit of the general formula:

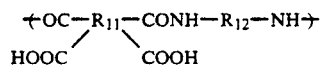
(6)

wherein $R_{11}$ has the same meaning as $R_1$ in the general formula (1); and $R_{12}$ has the same meaning as $R_2$ in the general formula (1).

The polymer containing the repeating unit of the general formula (1) can be a reaction product of a compound of the general formula (7) and/or a compound of the general formula (8) with a compound of the general formula (9):

(7)

(8)

(9)

wherein $R_{13}$ and $R_{14}$ have the same meaning as $R_1$ in the general formula (1): $R_{15}$ has the same meaning as $R_2$ in the general formula (1); $X_1$ is a halogen atom or a hydroxyl group; and $Y_1$ is a monovalent group having an ethylenic unsaturated group.

The polymer containing the repeating unit of the general formula (1) can be a photosensitive adduct of a polymer containing a repeating unit of the general formula:

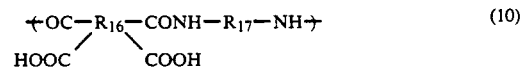
(10)

wherein $R_{16}$ is a tetravalent organic group, $R_{17}$ is a divalent organic group, at least either $R_{16}$ or $R_{17}$ being chosen so that this repeating unit contains at least one silicon atom, with an isocyanate compound having at least one ethylenic unsaturated group.

The polymer containing the repeating unit of the general formula (1) can be a reaction product of a compound of the general formula (11) and/or a compound of the general formula (12) with a compound of the general formula (13):

(11)

(12)

(13)

wherein $R_{18}$ and $R_{19}$ are a tetravalent organic group, $R_{20}$ is a divalent organic group, at least either $R_{18}$, $R_{19}$ or $R_{20}$ being chosen so that the repeating unit contains at least one silicon atom; $X_2$ is a halogen atom or a hydroxyl group; and $Y_1$ is a monovalent group having an ethylenic unsaturated group.

The polymer containing the repeating unit of the general formula (1) can be a photosensitive adduct of a polymer containing a repeating unit of the general formula:

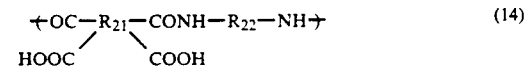
(14)

wherein $R_{21}$ is a tetravalent aromatic group, $R_{22}$ is a divalent aromatic group, at least either $R_{21}$ or $R_{22}$ being chosen so that this repeating unit contains at least one fluorine atom, with an isocyanato compound having at least one ethylenic unsaturated group.

In the general formula (14), $R_{21}$ can be a tetravalent aromatic tetracarboxylic acid residue of the general formula:

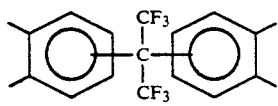
(24)

Further, in the formula (14), $R_{22}$ can be a divalent aromatic diamine residue of the general formula:

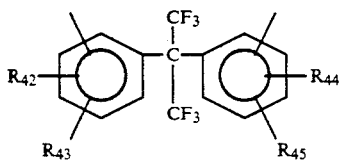
(26)

wherein $R_{42}$, $R_{43}$, $R_{44}$ and $R_{45}$ are independently a hydrogen atom or an alkyl group.

Further $R_{22}$ in the general formula (14) can be a divalent aromatic diamine residue of the general formula:

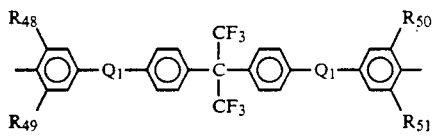
(28)

wherein $Q_1$ is an oxygen atom or a sulfur atom; and $R_{48}$, $R_{49}$, $R_{50}$ and $R_{51}$ are independently a hydrogen atom or an alkyl group.

In addition 21 in the general formula (14) can be a tetravalent aromatic tetracarboxylic acid residue of the above general formula (24); and $R_{22}$ is at least one aromatic diamine residue selected from the group consisting of divalent aromatic diamine residues of the above general formula (26) and divalent aromatic diamine residues of the above general formula (28).

The polymer containing the repeating unit of the general formula (1) can be a photosensitive adduct of an isocyanate compound having at least one ethylenic unsaturated group with a polymer containing a repeating unit of the general formula:

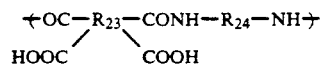
(15)

wherein $R_{23}$ is a tetravalent organic group, $R_{24}$ is a divalent organic group, $R_{23}$ and $R_{24}$ being chosen so that the repeating unit necessarily contains at least one silicon atom and at least one fluorine atom.

The polymer containing the repeating unit of the general formula (1) can be a reaction product of a compound of the general formula (16) and/or a compound of the general formula (17) with a compound of the general formula (18):

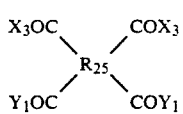
(16)

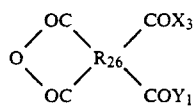
(17)

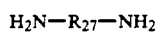
(18)

wherein $R_{25}$ and $R_{26}$ are a tetravalent organic group, $R_{27}$ is a divalent organic group, $R_{25}$, $R_{26}$ and $R_{27}$ being chosen so that the repeating unit necessarily contains at least one silicon atom and at least one fluorine atom; $X_3$ is a halogen atom or a hydroxyl group; and $Y_1$ is a monovalent group having an ethylenic unsaturated group.

The polymer containing the repeating unit of the general formula (1) can be a polymer containing a repeating unit of the general formula:

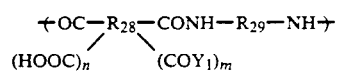
(19)

wherein $R_{28}$ is a silicon atom containing tetravalent organic group of the formula;

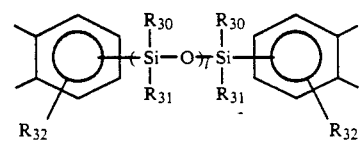
(20)

wherein $R_{30}$ and $R_{31}$ are independently a monovalent hydrocarbon group; $R_{32}$ is a hydrogen atom or a monovalent organic group; and l is zero or an integer of 1 to 20, $R_{29}$ is a divalent organic group; $Y_1$ is a monovalent group having an ethylenic unsaturated group; n is zero or 1, m is 1 or 2, n and m being chosen so that $n+m=2$.

The polymer containing the repeating unit of the general formula (1) can be a polymer containing a repeating unit of the formula;

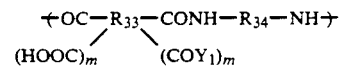
(21)

wherein $R_{33}$ is a tetravalent organic group, $R_{34}$ is a silicon atom-containing divalent organic group of the formula;

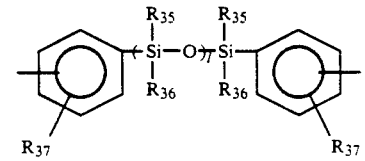
(22)

wherein $R_{35}$ and $R_{36}$ are independently a monovalent hydrocarbon group; $R_{37}$ is a hydrogen atom or a monovalent organic group; and l is zero or an integer of 1 to 20, $Y_1$ is a monovalent group having as ethylenic unsaturated group; n is zero or 1, m is 1 or 2, n and m being chosen so that n+m=2.

The polymer containing the repeating unit of the general formula (1) can be a polymer containing a repeating unit of the general formula;

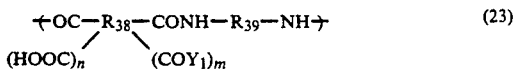 (23)

wherein $R_{38}$ is a fluorine atom-containing tetravalent organic group of the formula;

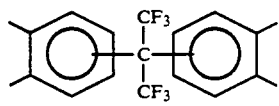 (24)

$R_{39}$ is a divalent organic group; $Y_1$ is a monovalent group having an ethylenic unsaturated group; n is zero or 1, m is 1 or 2, n and m being chosen so that n+m=2.

The polymer containing the repeating unit of the general formula (1) can be a polymer containing a repeating unit of the general formula:

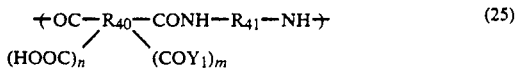 (25)

wherein $R_{40}$ is a tetravalent organic group, $R_{41}$ is a fluorine atom-containing divalent organic group of the formula;

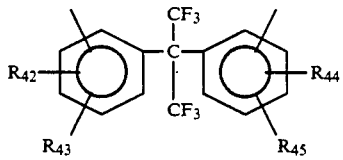 (26)

wherein $R_{42}$, $R_{43}$, $R_{44}$ and $R_{45}$ are independently a hydrogen atom or an alkyl group; $Y_1$ is a monovalent group having an ethylenic unsaturated group; n is zero or 1, m is 1 or 2, n and m being chosen so that n+m=2.

The polymer containing the repeating unit of the general formula (1) can be a polymer containing a repeating unit of the general formula:

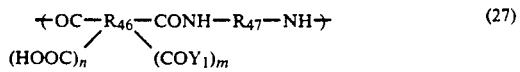 (27)

wherein $R_{46}$ is a tetravalent organic group, $R_{47}$ is a fluorine atom-containing divalent organic group of the formula;

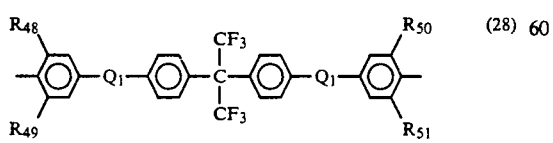 (28)

wherein $Q_1$ is an oxygen atom or a sulfur atom; and $R_{48}$, $R_{49}$, $R_{50}$ and $R_{51}$ are independently a hydrogen atom or an alkyl group; $Y_1$ is a monovalent group having an ethylenic unsaturated group; n is zero or 1, m is 1 or 2, n and m being chosen so that n+m=2.

The polymer containing the repeating unit of the general formula (1) can be a polymer containing a repeating unit of the general formula:

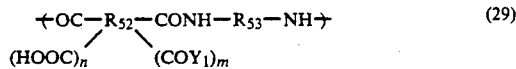 (29)

wherein $R_{52}$ is a tetravalent aromatic group of the formula (24), $R_{53}$ is at least one divalent aromatic group selected from the group consisting of divalent aromatic group of the above general formula (26) and divalent aromatic group of the above general formula (28); $Y_1$ is a monovalent group having an ethylenic unsaturated group; n is zero or 1, m is 1 or 2, n and m being chosen so that n+m=2.

The polymer containing the repeating unit of the general formula (1) can be a photosensitive adduct of a polymer containing a repeating unit of the general formula (30) and a repeating unit of the general formula (31);

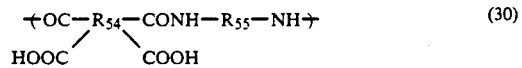 (30)

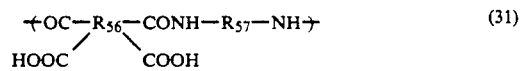 (31)

wherein $R_{54}$ is a tetravalent aromatic group; $R_{55}$ and $R_{57}$ are independently a divalent organic group; and $R_{56}$ is a silicon atom-containing tetravalent organic group of the formula:

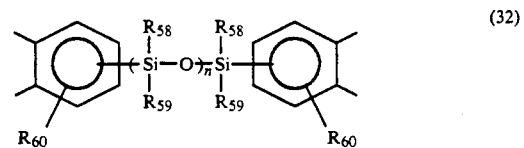 (32)

wherein $R_{58}$ and $R_{59}$ are independently a monovalent hydrocarbon group; $R_{60}$ is a hydrogen atom or a monovalent organic group; and n is zero or an integer of 1 to 20, with an isocyanate compound of the general formula (33) or an isocyanate compound of the general formula (34);

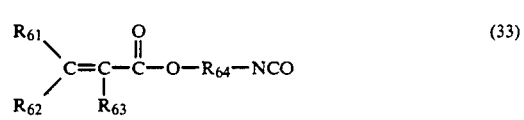 (33)

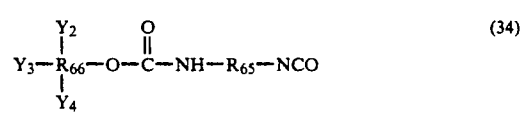 (34)

wherein $R_{61}$, $R_{62}$ and $R_{63}$ are independently a hydrogen atom or a methyl group; $R_{64}$ and $R_{65}$ are independently a divalent hydrocarbon group; $R_{66}$ is a tetravalent organic group; and $Y_2$, $Y_3$ and $Y_4$ are independently selected from the group consisting of hydrogen atom and monovalent organic groups having an ethylenic unsaturated group, at least one of $Y_2$, $Y_3$ and $Y_4$ being a monovalent organic group having an ethylenic unsaturated group.

The polymer containing the repeating unit of the general formula (1) can be a photosensitive adduct of a polymer containing a repeating unit of the general formula (35) and a repeating unit of the general formula (36):

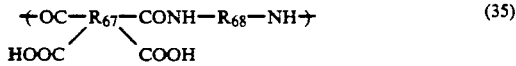

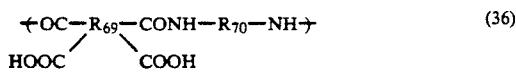

wherein $R_{67}$ and $R_{69}$ are independently a tetravalent organic group; $R_{68}$ is a divalent organic group; and $R_{70}$ is a silicon atom-containing divalent organic group of the general formula:

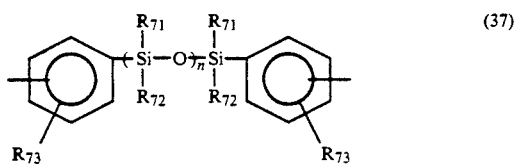

wherein $R_{71}$ and $R_{72}$ are independently a monovalent hydrocarbon group; $R_{73}$ is a hydrogen atom or a monovalent organic group; and n is zero or an integer of 1 to 20, with an isocyanate compound of the general formula (33) or an isocyanate compound of the general formula (34):

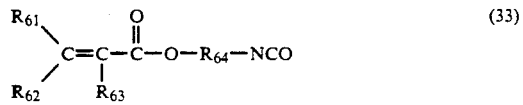

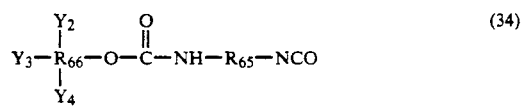

wherein $R_{61}$, $R_{62}$ and $R_{63}$ are independently a hydrogen atom or a methyl group; $R_{64}$ and $R_{65}$ are independently a divalent hydrocarbon group; $R_{66}$ is a tetravalent organic group; and $Y_2$, $Y_3$ and $Y_4$ are independently selected from the group consisting of hydrogen atom and monovalent organic groups having an ethylenic unsaturated group, at least one of $Y_2$, $Y_3$ and $Y_4$ being a monovalent organic group having an ethylenic unsaturated group.

The polymer containing the repeating unit of the general formula (1) used in this invention is obtained, for example, by reacting an isocyanato compound having at least one ethylenic unsaturated group with a polymer containing a repeating unit of the general formula:

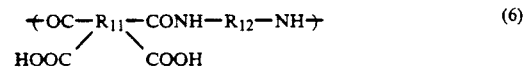

wherein $R_{11}$ has the same meaning as $R_1$ in the general formula (1) has; and $R_{12}$ has the same meaning as $R_2$ in the general formula (1) has.

The reaction of the isocyanato compound having at least one ethylenic unsaturated group with the polymer comprising recurring units of the general formula (6) is carried out in an inert organic solvent at a temperature of preferably 0° to 100° C., more preferably 20° to 70° C.

As the organic solvent used in the reaction, polar solvents capable of completely dissolving the polymer containing the repeating unit of the general formula (1), and there can be exemplified N-methyl-2-pyrrolidone, N,N-dimethylacetamide, N,N-dimethylformamide, dimethyl sulfoxide, tetramethylurea, hexamethylphosphoric triamide, γ-butyrolactone, N,N-dimethylpropylene urea, N,N-dimethylethylene urea, etc. These polar solvents can be used singly or in combination of two or more thereof.

In addition to these polar solvents, there can also be used common organic solvents such as ketones, esters, lactones, ethers, halogenated hydrocarbons, and hydrocarbons, for example, acetone, methyl ethyl ketone, methyl isobutyl ketone, cyclohexanone, methyl acetate, ethyl acetate, butyl acetate, diethyl oxalate, diethyl malonate, γ-butyrolactone, diethyl ether, ehtylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, xylene, etc.

In order to dissolve the polymer containing the repeating unit of the general formula (1) completely, these common organic solvents are used preferably in admixture with the above polar solvents. The using amount of these organic solvents is preferably 90 to 1,900 parts by weight, more preferably 150 to 500 parts by weight per 100 parts by weight of the polymer containing the repeating unit of the general formula (1).

As to the proportion of the isocyanato compound having at least one ethylenic unsaturated group to the polymer containing the repeating unit of the general formula (6), the isocyanato compound is usually reacted with said polymer in an amount of preferably 0.01 to 0.9 equivalent weight, more preferably 0.1 to 0.8 equivalent weight, most preferably 0.2 to 0.5 equivalent weight, per equivalent weight of the carboxyl group in said polymer from the viewpoint of the sensitivity of the photosensitive resin composition and the heat resitance of a final cured film.

The reaction of the isocyanato compound having one or more ethylenic unsaturated groups with the polymer containing the repeating unit of the general formula (6) can be facilitated using, for example, an amine such as triethylamine, 1,4-diazobicyclo[2,2,2]octane, etc., or a tin compound such as dibutyltin dilaurate, dibutyltin diacetate, etc., like a ctalyst. These compounds can be used usually in an amount of about 0.01 to about 5% by weight based on the weight of said isocyanate compound.

The isocyanate compound having at least one ethylenic unsaturated group used in this invention includes isocyanato compounds of the general formula (33) and isocyanato compounds of the general formula (34):

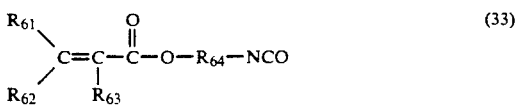

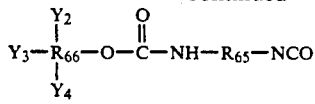
(34)

wherein $R_{61}$, $R_{62}$ and $R_{63}$ are independently a hydrogen atom or a methyl group; $R_{64}$ and $R_{65}$ are independently a divalent hydrocarbon group; $R_{66}$ is a tetravalent orgnic group; and $Y_2$, $Y_3$ and $Y_4$ are independently a group selected from the group consisting of hydrogen atom and monovalent organic groups having a carbon-carbon double bond, at least one of $Y_2$, $Y_3$ and $Y_4$ being a monovalent organic group having a carbon-carbon double bond.

The isocyanato compounds of the general formula (33) include, for example, isocyanatoethyl acrylate, isocyanatopropyl acrylate, isocyanatobutyl acrylate, isocyanatopentyl acrylate, isocyanatohexyl acrylate, isocyanatooctyl acrylate, isocyanatodecyl acrylate, isocyanatooctadecyl acrylate, isocyanatoethyl methacrylate, isocyanatopropyl methacrylate, isocyanatobutyl methacrylalte, isocyanatopentyl methacrylate, isocyanatohexyl methacrylate, isocyanatooctyl methacrylate, isocyanatodecyl methacrylate, isocyanatooctadecyl methacrylate, isocyanatoethyl crotonate, isocyanatopropyl crotonate, methacryloyl isocyanate, acryloyl isocyanate, isocyanatohexyl crotonate, etc. These isocyanato compounds can be used singly or in combiantion of two or more thereof.

Isocyanatoethyl methacrylate is commercially available, for example, from Dow Chemical Co. or Showa Denko K. K.).

The isocyanato compound of the general formula (34) is synthesized using a hydroxy compound having at least one ethylenic unsaturated group and a diisocyanate compound as starting materials.

The hydroxy compound having at least one ethylenic unsaturated group includes, for example, trimethylolpropane diacrylate, trimethylolpropane dimethacrylate, trimethylolethane diacrylate, trimethylolethane dimethacrylate, pentaerythritol triacrylate, pentaerythritol trimethacrylate, 2-hydroxyethyl acrylate, 2-hdyroxyethyl methacrylate, 2-hydroxypropyl acrylate, 2-hydroxypropyl methacrylate, 2-hydroxy-3-phenoxypropyl acrylate, 2-hydroxy-3-phenoxypropyl methacrylate, allyl alcohol, glycerol diallyl ether, trimethylolpropane diallyl ether, trimethylolethane diallyl ether, pentaerythritol diallyl ether, ethylene glycol monoallyl ether, diethylene glycol monoallyl ether, diglycerol triallyl ether, crotyl alcohol, vinylphenol, cinnamyl alcohol, alkylphenol, o-cinnamylphenol,

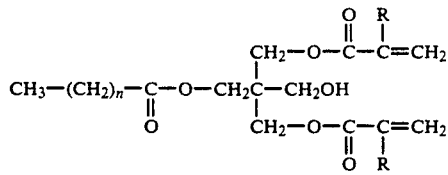

wherein n is an integer of 1 to 30, and R is H or $CH_3$,

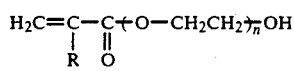

wherein n is an integer of 2 to 30, and R is H or $CH_3$,

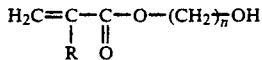

wherein n is an integer of 3 to 30, and R is H or $CH_3$

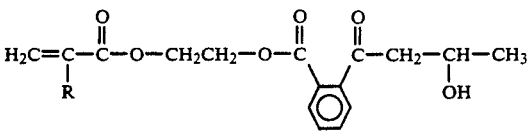

wherein R is H or $CH_3$,

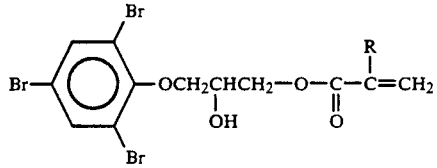

wherein R is H or $CH_3$, etc.

These hydroxy compounds can be used singly or in combination of two or more thereof.

The diisocyanate compound which reacts with hydroxy compound to give an isocyanate compound having a urethane linkage in the molecule, includes for example, 4,4'-diphenylmethane diisocyanate, dianisidine isocyanate, tolidine diisocyanate, hexamethylene diisocyanate, 2,4-tolylene diisocyanate, 2,6-tolylene diisocyanate, methaxylylene diisocyanate, 1,5-naphthalene diisocyanate, trans-vinylene diisocyanate, 2,2,4-trimethylhexamethylene diisocyanate, 2,4,4-trimethylhexamethylene diisocyanate, 3-isocyanatomethyl-3,5,5-trimethylcyclohexyl isocyanate,

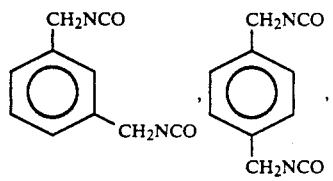

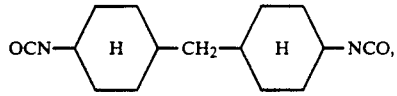

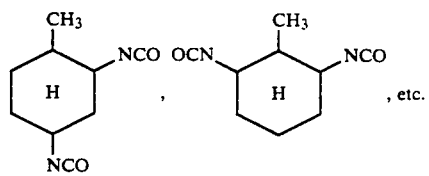

, etc.

These diisocyanate compounds can be used singly or in combiantion of two or more thereof.

The reaction of the hydroxy compound having at least one carbon-carbon double bond in the molecule with the diisocyanate compound is carried out without a solvent or in an inert organic solvent at a temperature of usually 0° to 100° C., preferably 20° to 70° C. The molar ratio of the hydroxy compound to the diisocyanate compound is preferably 0.8/1–1.2/1. More preferably, they are used in equimolar amounts.

The reaction of the hydroxy compound having at least one carbon-carbon double bond in the molecule with the diisocyanate compound can be facilitated using an amine such as triethylamine, 1,4-diazobicyclo[2,2,2]-octane, etc. or a tin compound such as dibutyltin diacetate, etc., like a catalyst.

These compounds can be used usually in an amount of about 0.01 to 5% by weight based on the diisocyanate compound.

In addition, the isocyanato compounds of the general formula (33) and the isocyanato compounds of the general formula (34) can be used singly or in combination of two or more thereof.

The isocyanato compounds of the general formula (34) include, for example,

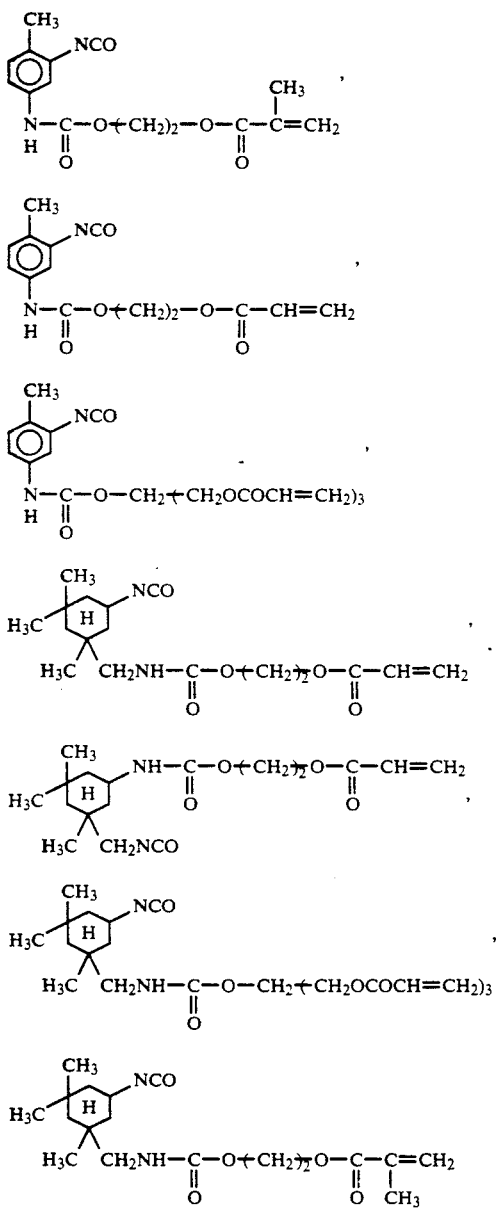

The polymer containing the repeating unit of the general formula (6) can be obtained by a conventional method, for example, by using at least one predetermined tetracarboxylic acid dianhydride and at least one predetermined diamine as starting materials.

In detail, the polymer containing the repeating unit of the general formula (6) can be obtained by a conventional method by choosing a combination of the starting tetracarboxylic acid dianhydride and diamine in which (i) at least either the tetracarboxylci acid dianhydride or the diamine contains one or more silicon atoms, (ii) at least either the tetracarboxylic acid dianhydride or the diamine contains one or more fluorine atoms, or (iii) both the tetracarboxylic acid dianhydride and the diamine necessarily contain one or more silicon atoms and one or more fluorine atoms. In this case, the silicon atoms are contained preferably in the form of a siloxane group.

In the above, the reaction of the tetracarboxylic acid dianhydride with the diamine is carried out in an inert organc solvent preferably at 0° to 100° C., more preferably 10° to 80° C.

As the organic solvent used in the reaction of the tetracarboxylic acid dianhydride with the diamine, there can be used the polar solvents and the common organic solvents which are usable in the above reaction of the polymer containing the repeating unit of the general formula (6) with the isocyanato compound having at least one ethylenic unsaturated group.

In order to dissolve the polymer containing the repeating unit of the general formula (6) completely, the common organic solvents are used preferably in admixture with the polar solvents. The using amount of these organic solvents is preferably 90 to 1,900 parts by weight, more preferably 150 to 500 parts by weight per 100 parts by weight of the polymer containing the repeating unit of the general formula (6).

The tetracarboxylic acid dianhydride and the diamine are used preferably in the ratio of 0.8/1-1.2/1 by mole, more preferably in equimolar amounts.

When as the tetracarboxylic acid dianhydride and the diamine which are used in this invention, there are combined at least one starting tetracarboxylic acid dianhydride and at least one starting diamine at least either of which contains one or more silicon atoms, there are the following three cases:

(i) the starting tetracarboxylic acid dianhydride contains one or more silicon atoms, (ii) the starting diamine contains one or more silicon atoms, (iii) both the starting tetracarboxylic acid dianhydride and the starting diamine contain one or more silicon atoms. The resulting photosensitive resin composition of this invention contains one or more silicon atoms, so that it is excellent in light-transmitting properties and solubility, can be formed into a thick film, and gives a final cured films having excellent adhesive properties and mechanical properties.

From the viewpoint of, for example, the light-transmitting properties of the photosensitive resin composition of this invention, its solubility in a developing solution, and the heat resistance and adhesive properties of a final cured film, the starting materials are preferably used as follows:

in the case of (i), a tetracarboxylic acid dianhydride containing neither silicon atom nor fluorine atom and a tetracarboxylic acid dianhydride containing one or more silicon atoms are used in this invention so as to adjust the molar ratio of the tetracarboxylic acid dianhydride containing neither silicon atom nor fluorine atom to the tetracarboxylic acid dianhydride containing one or more silicon atoms to preferably 20/1-0.8/1, more preferably 5/1-1.5/1, most preferably 3/1 to 2/1;

in the case of (ii), a diamine containing neither silicon atom nor fluorine atom and a diamine containing one or more silicon atoms are used in this invention so as to adjust the molar ratio of the diamine containing neither silicon atom nor fluorine atom to the diamine conaining one or more silicon atoms to preferably 20/1-0.8/1, more preferably 5/1-1.5/1, most preferably 3/1-2/1;

in the case of (iii), a tetracarboxylic acid dianhydride containing neither silicon atom nor fluorine atom, a diamine containing neither silicon atom nor fluorine atom, a tetracarboxylic acid dianhydride containing one or more silicon atoms, and a diamine containing one or more silicon atoms are used in this invention so as to adjust the molar ratio of the sum of the tetracarboxylic acid dianhydride containing neither silicon atom nor fluorine atom and the diamine containing neither silicon atom nor fluorine atom to the sum of the tetracarboxylic acid dinahydride containing one or more silicon atoms and the diamine containing one or more silicon atoms to preferably 20/1-0.8/1, more preferably 5/1-1.5/1, most preferably 3/1-2/1.

When as the tetracarboxylic acid dianhydride and the diamine which are used in this invention, there are combined at least one starting tetracarboxylic acid dianhydride and at least one starting diamine at least either of which contains one or more fluorine atoms, there are the following three cases:

(i) the starting tetracarboxylic acid dianhydride contains one or more fluorine atoms, (ii) the starting diamine containing one or more fluorine atoms, (iii) both the starting tetracarboxylic acid dianhydride and the starting diamine contain one or more fluorine atoms. The resulting photosensitive resin composition of this invention contains one or more fluorine atoms, so that it is excellent in light-transmitting properties and solubility, can be formed into a thick film, and gives a final cured film having excellent electrical properties and mechanical properties.

From the viewpoint of, for example, the light-transmitting properties of the photosensitive resin composition of this invention, its solubility in a developing solution, and the heat resistance and electrical properties of a final cured film, the starting materials are preferably used as follows:

in the case of (i), a tetracarboxylic acid dianhydride containing no fluorine atom and a tetracarboxylic acid dianhydride containing one or more fluorine atoms are used in this invention so as to adjust the molar ratio of the tetracarboxylic acid dianhydride containing two fluorine atom to the tetracarboxylic acid dianhydride containing one or more fluorine atoms to preferably 30/1-0.8/1, more preferably 5/1-1.5/1, most preferably 3/1-2/1;

in the case of (ii), a diamine containing no fluorine atom and a diamine containing one or more fluorine atoms are used in this invention so as to adjust the molar ratio of the diamine containing no fluorine atom to the diamine containing one or more fluorine atoms to preferably 20/1-0.8/1, more preferably 5/1-1.5/1, most preferably 3/1-2/1;

in the case of (iii), a tetracarboxylic acid dianhydride containing neither silicon atom nor fluorine atom, a diamine containing neither silicon atom nor fluorine atom, a tetracarboxylic acid dianhydride containing one or more fluorine atoms, and a diamine containing one or more fluorine atoms are used in this invention so as to adjust the molar ratio of the sum of the tetracarboxylic acid dianhydride containing neither fluorine atom nor silicon atom and the diamine containing neither silicon atom nor fluorine atom to the sum of the tetracarboxylic acid dianhydride containing one or more fluorine atoms and the diamine containing one or more fluorine atoms to preferably 20/1-0.8/1, more preferably 5/1-1.5/1, most preferably 3/1-2/1.

When as the tetracarboxylic acid dianhydride and the diamine which are used in this invention, there are combined at least one starting tetracarboxylic acid dianhydride and at least one starting diamine both of which necessarily contain one or more silicon atoms and one or more fluorine atoms, the resulting photosensitive resin composition contains both silicon atom(s) and fluorine atom(s), so that it is excellent in light-transmitting properties and solubility, can be formed into a thick film, and gives a final cured film having excellent adhesive properties, mechanical properties and electrical properties. Furthermore, the photosensitive resin composition possesses further improved light-transmitting properties and solubility because it contains both silicon atom(s) and fluorine atom(s).

From the viewpoint of, for example, the light-transmitting properties of the photosensitive resin composition of this invention, its solubility in a developing solution, and the electrical properties, heat resistance and adhesive properties of a final cured film, each compound constituting the tetracarboxylic acid dianhydride, i.e., a tetracarboxylic acid dianhydride containing one or more silicon atoms, a tetracarboxylic acid dianhydride containing one or more fluorine atoms, or a tetracarboxylic acid dianhydride containing neither silicon atom nor fluorine atom is used preferably in an amount of 5 to 85 mole %, 5 to 85 mole % or 10 to 90 mole %, respectively, based on the total number of moles of tetracarboxylic acid dianhydrides, more preferably in an amount of 10 to 75 mole %, 10 to 75 mole % or 15 to 80 mole %, respectively, based on the total number of moles of tetracarboxylic acid dianhydride.

The constituent (A), i.e., the polymer containing the repeating unit of the general formula (1), which is used in this invention can be obtained, for example, by polycondensation of a compound of the general formula (7) (hereinafter referred to merely as "compound ①") and/or a compound of the general formula (8) (hereinafter referred to merely as "compound ⓘⓘ") with a compound of the general formula (9) (hereinafter referred to merely as "compound ⓘⓘⓘ").

(7)

(8)

(9)

wherein $R_{13}$ and $R_4$ have the same meaning as $R_1$ in the general formula (1) has; $R_{15}$ has the same meaning as $R_2$ in the general formula (1) has; $X_1$ is a halogen atom or a hydroxyl group; and $Y_1$ is a monovalent group having an ethylenic unsaturated group.

The reaction of compound (I) and/or compound (II) with compound (III) is carried out in an insert solvent at a temperature of preferably 0° to 100° C., more preferably 5° to 60° C.

Compound (I) and/or compound (II) and compound (III) are preferably used so as to adjust the molar ratio of compound (I) and/or compound (II) to compound (III) to 0.8/1–1.2/1. More preferably, the using amount of compound (I) and/or compound (II) is substantially equmolar with compound (III).

The reaction of compound (I) and/or compound (II) with compound (III) can be accelerated using like a catalyst a carbodiimide type dehydrating-condensation agent such as dicyclohexylcarbodiimide, or a dehydrogenating agent, e.g. an amine such as pyridine or triethylamine.

As the organic solvent used in the above reaction, polar solvents capable of completely dissolving the resulting polymer containing the repeating unit of the general formula (1), i.e., the component (A), are generally preferable, and there can be exemplified N-methyl-2-pyrrolidone, N,N-dimethylacetamide, N,N-dimethylformamide, dimethyl sulfoxide, tetramethylurea, hexamethylphosphoric triamide, γ-butyrolactone, N,N-dimethylpropyleneurea, N,N-dimethylethyleneurea, etc.

In addition to these polar solvents, there can be used the common organic solvents usable in the above reaction of the polymer containing the repeating unit of the general formula (6) with the isocyanato compound having at least one ethylenic unsaturated group.

In order to dissolve the polymer containing the repeating unit of the general formula (1) completely, the common organic solvents are used preferably in admixture with the above polar solvents. The using amount of these organic solvent is preferably 90 to 1,900 parts by weight, more preferably 150 to 500 parts by weight per 100 parts by weight of the polymer containing the repeating unit of the general formula (1).

For isolating the polymer from the reaction mixture as occasion demands, it is preferable to add the reaction mixture in small portions to an alcohol or water.

The solid thus obtained can be purified by repetitions of redissolution in the same organic solvent as used in the reaction and reprecipitation with an alcohol or water.

Compound (I) or compound (II) can be obtained, for example by converting the above-mentioned tetracarboxylic acid dianhydride containing one or more silicon atoms, tetracarboxylic acid dianhydride containing one or more fluorine atoms, or tetracarboxylic acid dianhydride containing neither silicon atom nor fluorine atom, into a half ester by the whole or partial ring opening using a hydroxy compound having at least one ethylenic unsaturated group, and if necessary, converting the half ester into an acid halide by use of thionyl chloride, phosphorus pentachloride or the like. The above reaction of the tetracarboxylic acid dianhydride with a hydroxy compound having at least one ethylenic unsaturated group can be accelerated, for example, by adding pyridine, dimethylaminopyridine, or the like.

As the hydroxy compound having at least one ethylenic unsaturated group, there can be used the hydroxy compounds having at least one ethylenic unsaturated group whcih are usable as a starting material for the isocyanato compound of the general formula (34).

Compounds (I) and/or compounds (II) which are used in this invention are divided into three groups i.e., compounds containing one or more silicon atoms, compounds containing one or more fluorine atoms, and compounds containing neither silicon atom nor fluorine atom. By combining these compounds properly with a diamine containing one or more silicon atoms, a diamine containing one or more fluorine atoms, and/or a diamine containing neither silicon atom nor fluorine atom, there can be obtained any of the following three polymers containing the repeating unit of the general formula (1):

(i) a polymer containing silicon atoms (ii) a polymer containing fluorine atoms (iii) a polymer containing silicon atoms and fluorine atoms.

In the case of the polymer containing silicon atoms of (i), the photosensitive resin composition of this invention is excellent in light-transmitting properties and solubility, can be formed into a thick film, and gives a final cured film having excellent adhesive properties.

From the viewpoint of, for example, the light-transmitting properties of the photosensitive resin composition of this invention, its solubility in a developing solution, and the heat resistance and adhesive properties of a final cured film, the compound containing neither silicon atom nor fluorine atom, the diamine containing neither silicon atom nor fluorine atom, the compound containing one or more silicon atoms, and the diamine containing one or more silicon atoms are used so as to adjust the molar ratio of the sum of the compound containing neither silicon atom nor fluorine atom and the diamine containing neither silicon atom nor fluorine atom to the sum of the compound containing one or more silicon atoms and the diamine containing one or more silicon atoms to preferably 20/1–0.8/1, more preferably 5/1–1.5/1.

In the case of the polymer containing fluorine atoms of (ii), the photosensitive resin composition of this invention is excellent in light-transmitting properties and solubility, can be formed into a thick film, and gives a final cured film having excellent electrical properties.

From the viewpoint of, for example, the light-transmitting properties of the photosensitive resin composition of this invention, its solubility in a developing solution, and the electrical properties of a final cured film, the compound containing neither silicon atom nor fluorine atom, the diamine containing neither silicon atom nor fluorine atom, the compound containing one or more fluorine atoms, and the diamine containing one or more fluorine atoms are used so as to adjust the molar ratio of the sum of the compound containing neither silicon atom nor fluorine atom and the diamine containing neither silicon atom nor fluorine atom to the sum of the compound containing one or more fluorine atoms and the diamine containing one or more fluroine atoms to preferably 20/1–0.8/1, more preferably 5/1–1.5/1.

As the diamine containing one or more fluorine atoms, it is preferable from the viewpoint of electrical properties to use a diamine represented by the general formula (28-2):

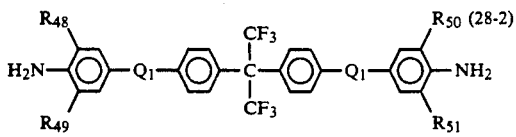

wherein $Q_1$, $R_{48}$, $R_{49}$, $R_{50}$ and $R_{51}$ have the same meanings as defined in the general formula (28).

In the case of the polymer containing silicon atoms and fluorine atoms of (iii), the photosensitive resin composition of this invention is excellent in light-transmitting properties and solubility, can be formed into a thick film, and gives a final cured film having excellent adhesive properties and electrical properties.

From the viewpoint of, for example, the light-transmitting properties of the photosensitive resin composition of this invention, its solubility in a developing solution, and the heat resistance and electrical properties of a final cured film, each compound constituting the tetracarboxylic acid dianhydride, i.e., an aromatic tetracarboxylic acid dianhydride containing one or more fluorine atoms, an aromatic tetracarboxylic acid dianhydride having a siloxane group, or an aromatic tetracarboxylic acid dianhydride is used in this invention preferably in an amount of 5 to 85 mole %, 5 to 85 mole % or 10 to 90 mole %, respectively, based on the total number of moles of tetracarboxylic acid dianhydrides, more preferably in an amount of 10 to 75 mole %, 10 to 75 mole % or 15 to 80 mole %, respectively, based on the total number of moles tetracarboxylic acid dianhydrides.

The tetracarboxylic acid dianhydride containing one or more silicon atoms in this invention includes, for example

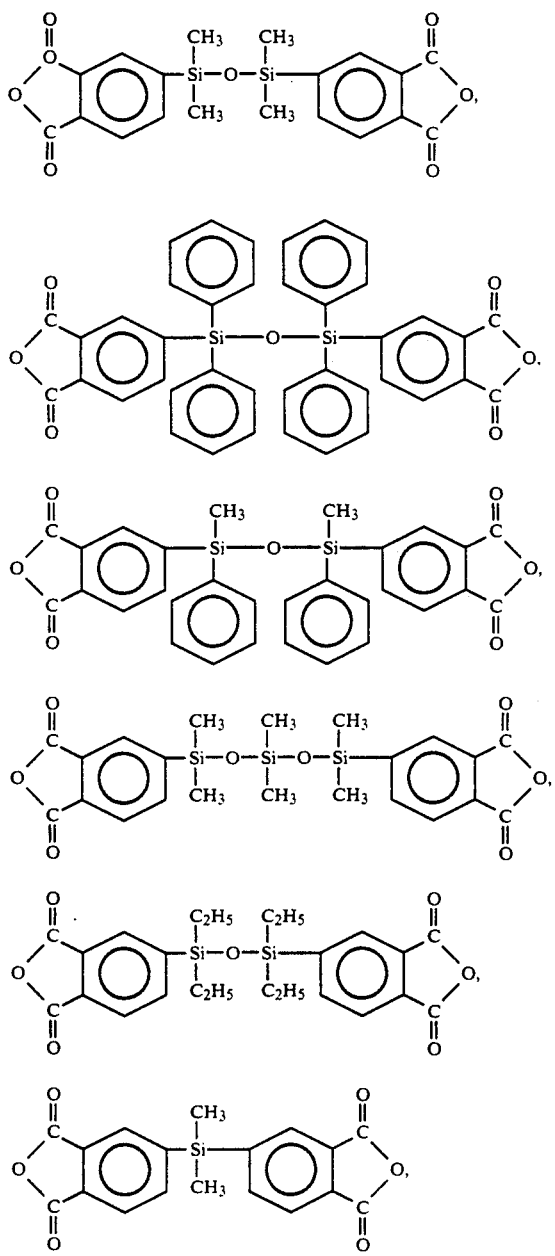

-continued
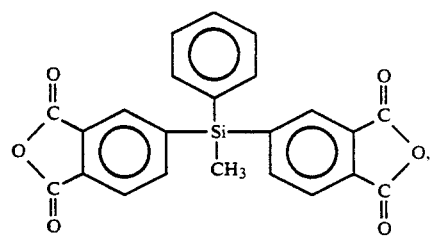
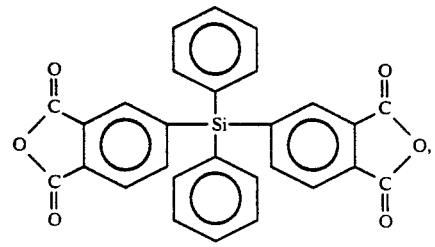
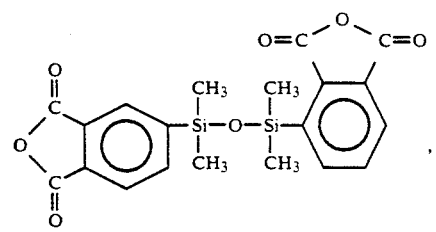
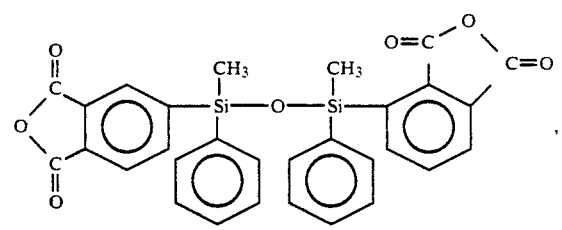
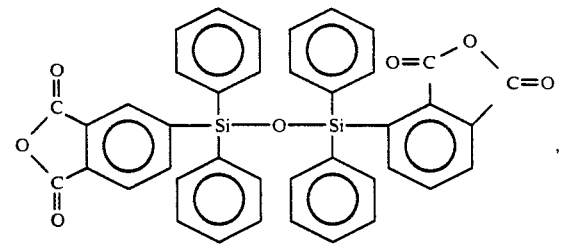
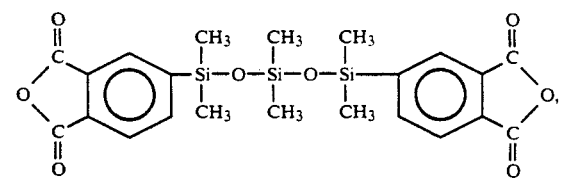
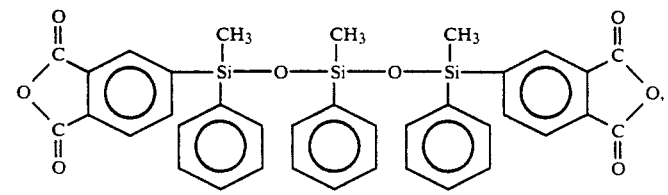

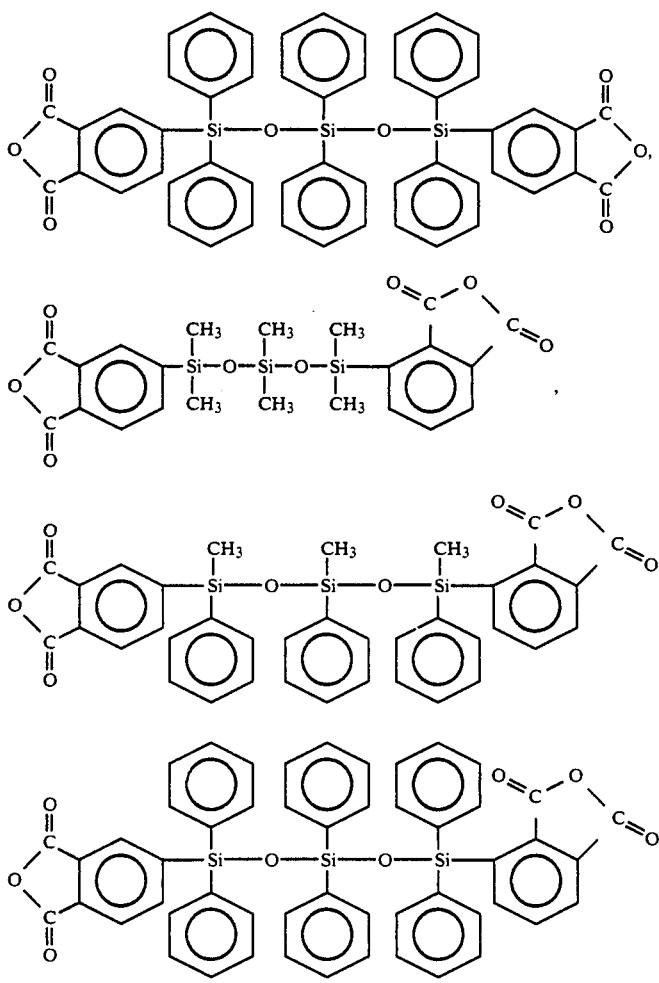

Needless to say, the benzene rings of these tetracarboxylic acid dianhydrides containing one or more silicon atoms may be substituted by substituents such as alkyl groups, etc. These silicon atom containing tetracarboxylic acid dianhydrides can be used singly or in combination of two or more thereof. Among them,

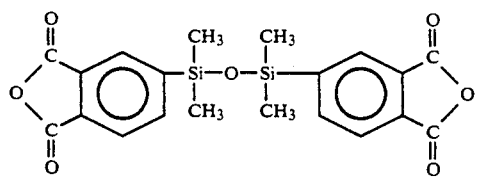

is commercially available from organic synthesis pharmaceutical companies, etc., is easily available, and is preferable from the viewpoint of, for example, the heat resistance of the photosensitive resin composition.

The tetracarboxylic acid dianhydride containing one or more fluorine atoms used in this invention includes, for example, 2,2-bis(3,4-dicarboxyphenyl)hexafluoropropane dianhydride, 2,2-bis[4-(3,4-dicarboxyphenoxy)-phenyl]hexafluoropropane dianhydride, 2,2-bis-[4-(2,3-dicarboxyphenoxy)phenyl]hexafluoropropane dianhydride, (trifluoromethyl)pyromellitic dianhydride, bis(trifluoromethyl)pyromellitic dianhydride, 3,3'-bis(trifluoromethyl)-4,4',5,5'-tetracarboxybiphenyl dianhydride, 2,2',5,5'-tetrakis(trifluoromethyl)-3,3',4,4'-tetracarboxybiphenyl dianhydride, 3,3'-bis(trifluoromethyl)-4,4',5,5'-tetracarboxybiphenyl ether dianhydride, 2,2'-bis(trifluoromethyl)-4,4',5,5'-tetracarboxybiphenyl ether dianhydride, 3,3'-bis(trifluoromethyl)-4,4',5,5'-tetracarboxybenzophenone dianhydride, 2,2'-bis(trifluoromethyl)-4,4',5,5'-tetracarboxybenzophenone dianhydride, 1,4-bis[3-(trifluoromethyl)-4,5-dicarboxyphenoxy]benzene dianhydride, 1,4-bis[2-(trifluoromethyl)-4,5-dicarboxyphenoxy]benzene dianhydride, 4,4'-bis[3-(trifluoromethyl)-4,5-dicarboxyphenoxy]biphenyl dianhydride, 1-trifluoromethyl-2,5-bis[3-(trifluoromethyl)-4,5-dicarboxyphenoxy]benzene dianhydride, 1,1'-bis(trifluoromethyl)-3,3'-bis[3-(trifluoromethyl)-4,5-dicarboxyphenoxy]biphenyl dianhydride, 4,4'-bis[3-(trifluoromethyl)-4,5-dicarboxyphenoxy]biphenyl ether dianhydride, 1-trifluoromethyl-3,5-bis(3,4-dicarboxyphenyl)benzene dianhydride, 1,4-bis(trifluoromethyl)-3,5-bis(3,4-dicarboxyphenyl)benzene dianhydride, 1,2,4,6-tetrakis(trifluoromethyl)-3,5-bis(3,4-dicarboxyphenyl)benzene dianhydride, 1,1'-bis(trifluoromethyl)-3,3'-(3,4-dicarboxyphenoxy)biphenyl dianhydride, 1,1',4,4'-tetrakis(trifluoromethyl)-3,3'-(3,4-dicarboxyphenoxy)biphenyl dianhydride, 2,2-bis[4-(2,3-dicarboxybenzoyloxy)phenyl]hexafluoropropane dianhydride, 2,2-bis[3-methyl-4-(2,3-dicarboxybenzoyloxy)phenyl]hexafluoropropane dianhydride, 2,2-bis[4-(2-trifluoromethyl-3,4-dicarboxybenzoyloxy)phenyl]hexafluoropropane dianhydride, 1,5-bis[4-(3,4-dicarboxybenzoyloxy)phenyl]decafluoropentane dianhydride, 1,3-bis[4-(3,4-dicarboxybenzoyloxy)phenyl]hexafluoropropane dianhydride, 1,6-bis[4-(3,4-dicarboxybenzoyloxy)phenyl] dodecafluorohexane dianhydride, 2,2-bis[3,5-dimethyl-4-(3,4-dicarboxyphenoxy)phenyl]hexafluoropropane dianhydride, 2,2-bis[4-(3,4-dicarboxyphenoxy)phenyl]octafluorobutane dianhydride, 2,2-bis-[4-(2-trifluoromethyl-3,4-dicarboxy)phenyl]hexafluoropropane dianhydride, 1,3-bis[4-(3,4-dicarboxyphenoxy)-phenyl]hexafluoropropane dianhydride, 1,5-bis[4-(3,4-dicarboxyphenoxy)phenyl]decafluoropentane dianhydride, 1,6-bis[4-(3,4-dicarboxyphenoxy)phenyl]dodecafluoropropane dianhydride, etc. These fluorine atom containing tetracarboxylic acid dianhydrides can be used singly or in combination of two or more thereof. Of these, 2,2-bis(3,4-dicarboxyphenyl)hexafluoropropane dianhydride is commercially available from Central Glass Co., Ltd., Hoechst Celanese Corp., etc., is easily available, and is preferable from the viewpoint of the heat resistance of the photosensitive resin composition.

The tetracarboxylic acid dianhydride containing neither silicon atom nor fluorine atom used in this invention includes pyromellitic dianhydride, 3,3',4,4'-benzophenonetetracarboxylic dianhydride, 3,3',4,4'-biphenyltetracarboxylic dianhydride, m-terphenyl-3,3',4,4'-tetracarboxylic dianhydride, p-terphenyl-3,3',4,4'-tetracargoxylic dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 1,4,5,8-naphthalenetetracarboxylic dianhydride, 3,4,9,10-perylenetetracarboxylic dianhydride, 4,4'-sulfonyldiphthalic dianhydride, bis(3,4-dicaboxyphenyl) ether dianhydride, 2,2-bis(3,4-dicarboxyphenyl)propane dianhydride, butanetetracarboxylic dianhydride, cyclobutanetetracarboxylic dianhydride, 5-(2,5-dioxatetrahydrofuryl)-3-methyl-3-cyclohexene-1,2-dicarboxylic dianhydride, dicyclohexyl-3,4,3',4'-tetracarboxylic dianhydride, etc. These tetracarboxylic acid dianhydrides containing neither silicon atom nor fluorine atom can be used singly or in combiantion of two or more thereof.

Needless to say, the benzene rings of these tetracarboxylic acid dinhydrides may be substituted by substituents such as alkyl groups, etc.

The diamine containing one or more silicon atoms used in this invention includes, for example,

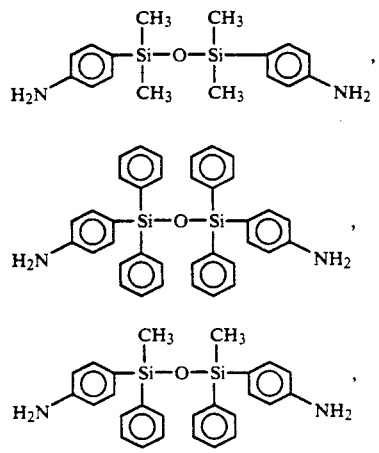

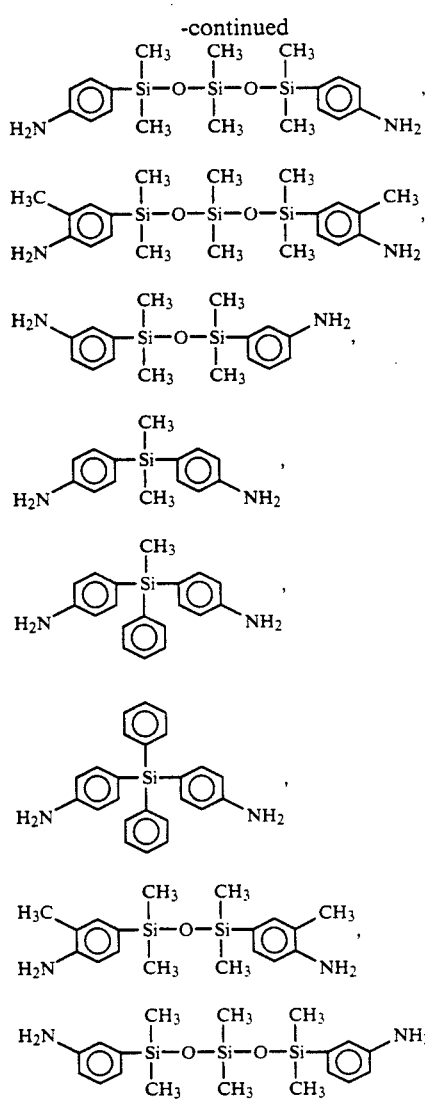

These silicon atom-containing diamines can be used singly or in combination of two or more thereof.

The diamine containing one or more fluorine atoms used in this invention includes, for example, 2,2-bis(4-aminophenyl)hexafluoropropane, 2,2-bis(3-amino-4-methylphenyl)hexafluoropropane, 2,2-bis(3-methyl-4-aminophenyl)hexafluoropropane, 2,2-bis(3,5-dimethyl-4-aminophenyl)hexafluoropropane, 2,2-bis[4-(4-aminophenoxy)phenyl] hexafluoropropane, 2,2-bis[3,5-dimethyl-4-(4-aminophenoxy)phenyl]hexafluoropropane, 1,4-bis[2-(trifluoromethyl)-4-aminophenoxy]benzene, 4,4'-bis-[2-(trifluoromethyl)-4-aminophenoxy)-biphenyl, 4,4' -bis[2-(trifluoromethyl)-4-aminophenoxy]diphenyl sulfone, 4,4'-bis[4-(4-aminophenylthio)-phenyl]biphenyl, 2,2'-bis[4-(4-aminophenylthio)-phenyl]hexafluoropropane, 2,2'-bis[4-(2-trifluoromethyl-4-aminophenoxy)phenyl]phenyl]hexafluoropropane, etc. These fluorine atom-containing diamines can be used singly or in combination of two or more thereof. Of these, 2,2-bis(4-aminophenyl)hexafluoropropane and 2,2-bis[4-(4-aminophenoxy)phenyl]hexafluropropane are commercially available from Central Glass Co., Ltd., are easily available, and are preferable from the viewpoint of the heat resistance of the photosensitive resin composition.

The diamine containing neither silicon atom nor fluorine atom used in this invention includes, for example, 4,4'-diaminodiphenyl ether, 3,4'-diaminodiphenyl ether, 4,4'-diaminodiphenylmethane, 4,4'-diaminodiphenyl sulfone, 4,4'-diaminodiphenyl sulfide, benzidine, m-phenylenediamine, p-phenylenediamine, 1,5-naphthalenediamine, 2,6-naphthalenediamine, 2,2-bis(4-aminophenoxyphenyl)propane, bis(4-aminophenoxyphenyl) sulfone, 4,4'-diaminodiphenylethane, 3,3'-diaminobenzophenone, 4,4'-diaminobenzophenone, 3,3'-dimethyl-4,4'-diaminobiphenyl 3,4'-diaminobenzanilide, m-xylenediamine, p-xylylenediamine, etc.

These diamines containing neither silicon atom nor fluorine atom can be used singly or in combiantion of two or more thereof.

In addition to them, there can also be used diaminoamide compounds represented by the general formula:

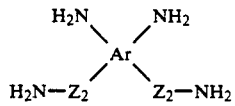  (38)

wherein Ar is an aromatic group; $Z_1$ is $SO_2$ or CO; and one of the amino groups and $Z_1$—$NH_2$ are in ortho positions in relation to each other.

The compounds of the general formula (38) include, for example, 4,4'-diaminodiphenylether-3-sulfonamide, 3,4'-diaminodiphenylether-4-sulfonamide, 3,4'-diaminodiphenylether-3'-sulfonamide, 3,3'-diaminodiphenylether-4-sulfonamide, 4,4'-diaminodiphenylmethane-3-sulfonamide, 3,4'-diaminodiphenylmethane-4-sulfonamide, 3,4'-diaminodiphenylmethane-3'-sulfonamide, 3,3'-diaminodiphenylmethane-4-sulfonamide, 4,4'-diaminodiphenylsulfone-3-sulfonamide, 3,4'-diaminodiphenylsulfone-4-sulfonamide, 3,4'-diaminodiphenylsulfone-3'-sulfonamide, 3,3'-diaminodiphenylsulfone-4-sulfonamide, 4,4'-diaminodiphenylsulfide-3-sulfonamide, 3,4'-diaminodiphenylsulfide-4-sulfonamide, 3,3'-diaminodiphenylsulfide- 4-sulfonamide, 3,4'-diaminodiphenylsulfide-3'-sulfonamide, 1,4-diaminobenzene-2-sulfonamide, 4,4'-diaminodiphenylether-3-carbonamide, 3,4'-diaminodiphenylether-4-carbonamide, 3,4'-diaminodiphenylether-3'-carbonamide, 3,3'-diaminodiphenylether-4-carbonamide, 4,4'-diaminodiphenylmethane-3-carbonamide, 3,4'-diaminodiphenylmethane-4-carbonamide, 3,4'-diaminodiphenylmethane-3'-carbonamide, 3,3'-diaminodiphenylmethane-4-carbonamide, 4,4'-diaminodiphenylsulfone-3-carbonamide, 3,4'-diaminodiphenylsulfone-4-carbonamide, 3,4'-diaminodiphenylsulfone-3'-carboanmide, 3,3'-diaminodiphenylsulfone-4-carbonamide, 4,4'-diaminodiphenylsulfide-3-carbonamide, 3,4'-diaminodiphenylsulfide-4-carbonamide, 3,3'-diaminodiphenylsulfide-4-carbonamide, 3,4'-diaminodiphenylsulfide-3'-sulfonamide, 1,4-diaminobenzene-2-carbonamide, etc.

These diaminoamide compounds can be used singly or in combination of two or more thereof.

If necessary, there can also be used diaminodiamide compounds represented by the general formula:

  (39)

wherein Ar is an aromatic group; $Z_2$ is $SO_2$ or CO; and one of the amino groups and one the $Z_2$—$NH_2$ groups are in ortho positions in relation to each other.

The compounds of the general formula (39) include, for example, 4,4'-diaminodiphenylether-3,3'-sulfonamide, 3,4'-diaminodiphenylether-4,5'-carbonamide, 3,3'-diaminodiphenylether-4,4'-sulfonamide, 4,4'-diaminodiphenylmethane-3,3'-carbonamide, 3,4'-diaminodiphenylmethane-4,5'-sulfonamide, etc.

These diaminodiamide compounds can be used singly or in combiantion of two or more thereof.

The constituent (B), the photoinitiator, which is used in this invention includes, for example, Michler's ketone, benzoin, 2-methylbenzoin, benzoin methyl ether, benzoin ethyl ether, benzoin isopropyl ether, benzoin butyl ether, 2-t-butylanthraquinone, 1,2-benzo-9,10-anthraquinone, anthraquinone, methylanthraquinone, 4,4'-bis(diethylamino)benzophenone, acetophenone, benzophenone, thioxanthone, 2,4-diethylthioxanthone, 1,5-acenaphthene, 2,2-dimethoxy-2-phenylacetophenone, 1-hydroxycyclohexyl phenyl ketone, 2-methyl-[4-(methylthio)phenyl]2-morpholono-1-propanone, diacetyl, benzil, benzyldimethylketal, benzyldiethylketal, diphenyl disulfide, anthracene, phenanthrenequinone, riboflavin tetrabutyrate, Acryl Orange, Erythrosine, phenanthrenequinone, 2-isopropylthioxanthone, 3,3-carbonyl-bis(7-diethylamino)coumarin, 2,6-bis(p-diethylaminobenzylidene)-4-methyl-4-azacyclohexanone, 6-bis(p-dimethylaminobenzylidene)-cyclopentanone, 2,6-bis(p-diethylaminobenzylidene)-4-phenylcyclohexanone, and aminostryl ketone of the formula:

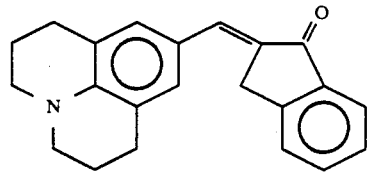

These photoinitiators of (B) can be used singly or in combination of two or more thereof.

Assistants of photoinitiator (①), such as amines and amino acids can be used together with these photoinitiators of (B).

The amines include, for example, ethyl p-dimethylaminobenzoate, methyl p-diethylaminobenzoate, ethyl p-diethylaminobenzoate, ethyl p-dimethylaminobenzoate, isoamyl p-dimethylaminobenzoate, p-dimethylaminobenzonitrile, ethyl N,N-dimethylanthranilate, etc.

The amino acids include, for example, N-phenylglycine, N-methyl-N-(p-chlorophenyl)glycine, N-ethyl-N-(p-chlorophenyl)glycine, N-(n-propyl)-N-(p-chlorophenyl)glycine, N-methyl-N-(p-bromophenyl)glycine, N-ethyl-N-(p-bromophenyl)glycine, N-(p-cyanophenyl)glycine, N-(p-chlorophenyl)glycine, N-(p-bromophenyl)glycine, etc.

These photoinitiators can be used singly or in combination of two or more thereof.

Assistants of photoinitiator ( II ) such as mercaptan compounds and oxime compounds can be used as a third component together with the photoinitiator of (B) and the assistant of photoinitiator ((I)).

The mercaptan compounds include, for example, 2-mercaptobenzimidazole, 1-phenyl-5-mercapto-1,2,3,4-tetrazole, 2-mercaptobenzothiazole, 2-benzoxazolethiol, thiomalic acid, 3-mercaptopropionic acid, etc.

The oxime compounds include, for example, 1-phenyl-propanedione-2-(o-ethoxycarbonyl)oxime, 1-phenyl-butanedione-2-(o-methoxycarbonyl)oximie, 1-phenyl-propanedione-2-(o-benzoyl)oxime, 1,2-diphenylethanedione-1-(o-benzoyl)oxime, 1,3-diphenyl-1,2,3-propanetrione-7-(o-n-propylcarbonyl)oxime, 1-(4'-methoxyphenyl)-3-(4'-nitrophenyl)-1,2,3-propanetrione-2-(o-phenyloxycarbonyl)oxime, 1,3-bis(4'-methoxyphenyl)-1,2,3-propanetrione-2-(o-ethoxycarbonyl)oxime, etc.

The using amount of the above-exemplified assistant of photoinitiator ((I)) and assistants of photoinitiator ( (II) ) is usually preferably 0.01 to 30 parts by weight, more preferably 0.1 to 10 parts by weight per 100 parts by weight of the constituent (A), i.e., the polymer containing the repeating unit of the general formula (1), from the viewpoint of the sensitivity of the photosensitive resin composition, the heat resistance of a coating film.

A conventional thermopolymerization inhibitor can be incorporated into the photosensitive resin composition in order to improve the thermal stability of said composition.

The thermopolymerization inhibitor includes, for example, p-methoxyphenol, hydroquinone, t-butylcatechol, pyrogallol, phenothiazine, chloranil, naphthylamine, α-naphthol, 2,6-di-t-butyl-p-cresol, pyridine, nitrobenzene, p-toluidine, methylene blue, 2,2'-methylenebis(4-methyl-6-t-butylphenol), 2,2'-methylenebis(4-ethyl-6-t-butylphenol), etc.

In this invention, if necessary, various polymerizable unsaturated compounds can be used. Among them, acrylic acid compounds, methacrylic acid compounds, etc. are practical.

Specific examples of the acrylic acid compounds are acrylic acid, methyl acrylate, ethyl acrylate, n-propyl acrylate, isopropyl acrylate, n-butyl acrylate, isobutyl acrylate, cyclohexyl acrylate, benzyl acrylate, carbitol acrylate, methoxyethyl acrylate, ethoxyethyl acrylate, butoxyethyl acrylate, hydroxyethyl acrylate, hydroxypropyl acrylate, butylene glycol monoacrylate, N,N-dimethylaminoethyl acrylate, N,N-diethylaminoethyl acrylate, glycidyl acrylate, tetrahydrofurfuryl acryalte, pentacrythritol monoacryalte, trimethylolpropane monoacrylate, allyl acrylate, 1,3-propylene glycol diacrylate, 1,4-butylene glycol diacrylate, 1,6-hexane glycol diacrylate, neopentyl glycol diacrylate, dipropylene glycol diacrylate, 2,2-bis(4-acryloxydiethoxyphenyl)-propane, 2,2-bis(4-acryloxypropyloxyphenyl)propane, trimethylolpropane diacrylate, pentacrythritol diacrylate, trimethylolpropane triacrylate, pentacrylthritol triacrylate, triacrylformal, tetramethylolmethane tetraacrylate, acrylic ester of tris(2-hydroxyethyl)isocyanuric acid,

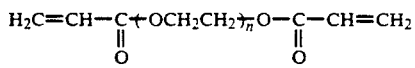

wherein n is an integer of 1 to 30,

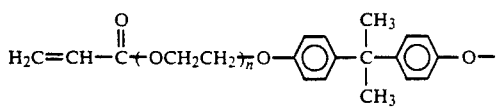

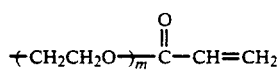

wherein n and m are independently integers and chosen so as to adjust n+m to 2−30,

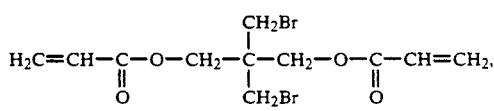

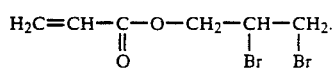

The methacrylic acid compounds include, for example, methacrylic acid, methyl methylacrylate, ethyl methacrylate, propyl methacrylate, isopropyl methacrylate, butyl methacrylate, isobutyl methacrylate, cyclohexyl methacrylate, benzyl methacrylate, octyl methacrylate, ethylhexyl methacrylate, methoxyethyl methacrylate, ethoxyethyl methacrylate, butoxyethyl methacrylate, hydroxyethyl methacrylate, hydroxypropyl methacrylate, hydroxybutyl methacrylate, hydroxypentyl methacrylate, N,N-dimethyl aminomethacrylate, N,N-diethyl aminomethacrylate, glycidyl methacrylate, tetrahydrofurfuryl methacrylate, methacryloxypropyltrimethoxysilane, allyl methacrylate, trimethylolpropane monomethacrylate, pentaerythritol monomethacrylate, 1,3-butylene glycol dimethacrylate, 1,6-hexane glycol dimethacrylate, neopentyl glycol dimethacrylate, 2,2-bis(4-methacryloxydiethoxyphenyl)propane, trimethylolpropane dimethacrylate, pentaerythritol dimethacrylate, trimethylolpropane triacrylate, pentaerythritol trimethacrylate, tetramethylolmethane tetramethacrylate, methacrylic ester of tris(2-hydroxyethyl)isocyanuric acid,

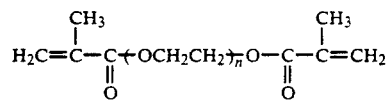

wherein n is an integer of 1 to 30,

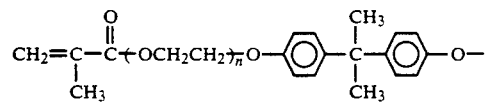

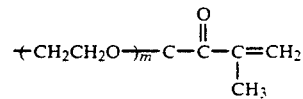

wherein n and m are independently integers and chosen so as to adjust n+m to 1-30,

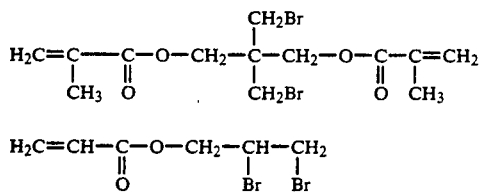

$$H_2C=CH-\underset{O}{\underset{\|}{C}}-O-CH_2-\underset{Br}{\underset{|}{CH}}-\underset{Br}{\underset{|}{CH_2}}$$

These compounds can be used singly or in combination of two or more thereof.

The photosensitive resin composition of this invention may contain other polymers, i.e., organic fillers such s poly(amic acid)s, polyimides, polyamides, polyether imides (or precursors thereof), polyamideimides (or precursors thereof), epoxy resins, acrylic resins, resol resins, novolak resins, urethane resins, melamine resins, polyester resins, silicone resins, etc. In this case, any of these resins may be contained so long as it is miscible with the polymer containing the repeating unit of the general formula (1), and these resins are contained in such an amount that they do not deteriorate the heat resistance, adhesive properties, electrical properties and mechanical properties of a final cured film.

The photosensitive resin composition of this invention may contain organic solvents.

As the organic solvents, there can be used, for example, solvents which are capable of completely dissolving the constituent (A), i.e., the polymer containing the repeating unit of the general formula (1). In this case, the using amount of the organic solvents is preferably 10 to 95% by weight, more preferably 30 to 80% by weight based on the weight of the photosensitive resin composition.

The photosensitive resin composition of this invention can be subjected to pattern formation by a conventional micro-fabrication technique.

The photosensitive resin composition of this invention can be formed into a coating film by coating the same on a base material such as glass substrate, silicon wafer, copper-clad laminate or the like by a means such as spin coating using a spinner, dipping, spraying, printing or the like, and then drying the coating.

The thickness of the coating film can be adjusted by properly choosing a coating means, the solid concentration and viscosity of a varnish of the photosensitive polymer composition of this invention, etc.

A coating film can be formed on a substrate to be coated, also by coating the photosensitive resin composition on a flexible base material, e.g. a polyester film, drying the same, thereby laminating the same on the substrate, optionally forming thereon a cover sheet of polyethylene or the like to produce a photosensitive element having a sandwich structure previously, and peeling off the cover sheet of the photosensitive element.

A cover sheet need not necessarily to be used.

When the coating film is irradiated with actinic rays through a mask having a desired pattern, polymerization occurs in the exposed portion, so that the exposed portion is greatly decreased in solubility as compared with the unexposed portion.

Although ultraviolet rays are usually used as the actinic rays, the same effect on the coating film as in the case of ultraviolet rays can be obtained by irradiating the coating film, if necessary, with ionizing radiation such as electron beams, radiation or the like.

When the coating film treated in the manner described above is treated with a suitable developing solution, the unexposed portion retaining a high solubility is developed and removed, while the exposed portion which has been decreased in solubility by the irradiation with actinic rays remains, whereby a desired resin pattern can be obtained.

As the developing solution, there can be used, for example, polar solvents such as N-methyl-2-pyrrolidone, N-acetyl-2-pyrrolidone, N,N-dimethylformamide, N,N-dimethylacetamide, dimethyl sulfoxide, hexamethylphosphortriamide, dimethylimidazolidinone, N-benzyl-2-pyrrolidone, N-acetyl-ε-caprolactam, N,N-dimethylpropyleneurea, N,N-dimethylethyleneurea, γ-butyrolactone, etc. These polar solvents can be used alone or as a mixed solution with common organic solvents such as methanol, ethanol, isopropanol, benzene, acetone, methyl ethyl ketone, cyclohexanone, cyclopentanone, toluene, xylene, methyl Cellosolve, ethyl acetate, methyl propionate, tetrahydrofuran, dioxane and the like, water, basic compounds, basic aqueous solutions, etc. Basic aqueous solutions alone or solutions prepared by mixing a basic aqueous solution with an alcohol can also be used as the developing solution.

The basic compounds include, for example, monoethanolamine, diethanolamine, triethanolamine, tetramethylammonium hydroxide, sodium carbonate, potassium carbonate, sodium phosphate, etc.

As the basic compounds, there can be used hydroxides, carbonates, hydrogencarbonates, silicates, phosphates, pyrophosphates, acetates, amines, etc. of alkali metals and quaternary ammonium.

Specific examples of these basic compounds are lithium hydroxide, sodium hydroxide, potassium hydroxide, ammonium hydroxide, trimethylbenzylammonium hydroxide, tetramethylammonium hydroxide, sodium carbonate, potassium carbonate, sodium hydrogencarbonate, sodium silicate, sodium phosphate sodium pyrophosphate, sodium acetate, monoethanolamine, diethanolamine, triethanolamine, etc.

In preparing a basic aqueous solution of the basic compound, the using amount of the basic compound is usually preferably 0.0001 to 30 parts by weight, more preferably 0.05 to 5 parts by weight per 100 parts of water.

The alcohol includes, for example, methanol, ethanol, isopropanol, n-propanol, n-butanol, n-pentanol, n-hexanol, n-heptanol, n-octanol, etc.

Subsequently, the developing solution can be removed by rinsing the relief pattern formed by the development with a rinsing liquid.

As the rinsing liquid, there can be used non-solvents for poly(amic acid) which are highly miscible with the developing solution, for example, methanol, ethanol, isopropanol, benzene, toluene, xylene, methyl Cellosolve, water etc.

The thus obtained resin pattern of thick film can be converted to a semiconductor element having a high heat resistance, an interlaminar insulating film or surface-protective film in a multilayer circuit board or the like, a color filter, etc. by subsequent baking at 150° to 400° C, i.e., post cure, and then if necessary, exposure to actinic rays. Therefore, the photosensitive resin composition of this invention is very useful mainly in the field of the micro-fabrication described above.

This invention is explained below with reference to Examples and Comparative Examples, which are not by way of limitation but by way of illustration.

REFERENTIAL EXAMPLE

In a 200-ml four-necked flask equipped with a thermometer, a nitrogen gas inlet and a stirrer were placed 17.4 g (0.1 mole) of 2,4-tolylene diisocyanate, 100 ml of dried methyl ethyl ketone and 2 mg of dibutyltin dilaurate, and stirred at room temperature while introducing dried nitrogen gas.

Subsequently, 11.6 g (0.1 mole) of 2-hydroxyethyl acrylate was added and the resulting solution was stirred at room temperature for 8 hours, after which the methyl ethyl ketone was removed to obtain an isocyanato compound.

In $^1$H-NMR spectrum of the product, there were observed a signal due to $-OCH_2CH_2O-$ at 4.35 ppm and a signal due to $-CH=CH_2$ at 5.7-6.4 ppm.

In IR spectrum of the product, an absorption due to amide group carbonyl stretching vibration was observed at 1650 cm$^{-1}$. The isocyanato compound obtained was named TD-HEA.

SYNTHETIC EXAMPLE 1

In a 1000-ml flask equipped with a thermometer and a stirrer were placed 133.2 g of 2,2-bis(3,4-dicarboxyphenyl)hexafluoropropane dianhdyride (mfd. by Central Glass Co., Ltd.) and 450 g of N-methyl-2-pyrrolidone as solvent, and stirred at room temperature.

Then, 60.1 g of 4,4'-diaminodiphenyl ether (mfd. by Mitsui Toatsu Chemicals, Inc.) was added to the resulting solution, and the resulting mixture was stirred at room temperature for 4 hours to obtain a viscous polymer solution.

Subsequently, 43.5 g of the isocyanato compounds TD-HEA obtained in Referential Example was added to the polymer solution and stirred for 8 hours at room temperature while shutting out the light. Carbon dioxide was generated during the reaction. The photosensitive adduct solution was named PI-1.

SYNTHETIC EXAMPLES 2 TO 42

In the same manner as in Synthetic Example 1, polymers PI-2 to PI-42 having the repeating unit of the general formula (1) were obtained by using tetracarboxylic acid dianhydride(s), diamine(s) and an isocyanato compound having at least one ethylenic unsaturated group, in the blending amounts shown in Table 1. Each of the polymers obtained in Synthetic Examples 27 to 38 was solidified by adding 80 ml of ethanol, followed by stirring for 3 hours and slow pouring into 8 liters of water.

SYNTHETIC EXAMPLE 43

To a mixture of 20.7 g (0.04 mole) of 2,2-bis(3,4-dicarboxyphenyl)hexafluoropropane dianhydride, 25.6 g (0.06 mole) of 1,3-bis(3,4-dicarboxyphenyl)-1,1,3,3-tetramethyldisiloxane dianhydride and 32.2 g (0.1 mole) of 3,3',4,4'-benzophenonetetracarboxylic dianhydride were added 400 ml of N-methyl-2-pyrrolidone and 520 g (0.4 mole) of 2-hydroxyethyl methacrylate as hydroxy compound having at least one ethylenic unsaturated group, and stirred at room temperature for 12 hours. To the resulting solution was added dropwise 70 g of thionyl chloride with ice-cooling over a period of 1 hour, and stirred at room temperature for 2 hours. To the solution thus obtained was added 40.0 g (0.2 mole) of 4,4'-diaminodiphenyl ether, and stirred for 8 hours.

Subsequently, 80 ml of ethanol was added and then stirred for 3 hours. The resulting solution was slowly poured into 8 liters of water, upon which a polymer was precipitated as a thread-like solid. This polymer was named PI-43.

SYNTHETIC EXAMPLES 44 TO 54

In the same manner as in Synthetic Example 43, polymers PI-44 to PI-54 were obtained by using tetracarboxylic acid dianhydride(s), diamine(s) and a hydroxy compound having at least one ethylenic unsaturated group, according to each recipe shown in Table 1.

EXAMPLE 1 TO 114

A photoinitiator of (B) and if necessary, a polymerizable unsaturated compound were added to each polymer having the repeating unit of the general formula (1) or solution thereof obtained in Synthetic Examples 1 to 54, and stirred and mixed therewith. Thus, there were obtained homogeneous solutions of photosensitive resin composition which were used in Examples 1 to 114.

Each of these solutions was passed through a filter, dropped on a silicon wafer, and spin coated thereon at a revolution rate of 2,000 r.p.m. for 30 minutes.

The coating film thus obtained was dried at 80° C. for 10 minutes and then its thickness was measured.

Next, the surface of the coating film was covered with a pattern mask and exposed to light from a ultra-high pressure mercury lamp (8 mW/cm$^2$) for 70 seconds.

The coating film was then developed with a mixture of equal amounts of N,N-dimethylacetamide and tetrahydrofuran for 50 seconds by means of a spray type developing machine, rinsed with isopropanol for 5 seconds to leave the portion irradiated by the ultra-high pressure mercury lamp, and dried by nitrogen spraying to obtain a relief pattern.

The cured state of the relief pattern was evaluated by calculating the yield of residual film thickness according to the equation:

$$\text{Yield of residual film thickness} = \left( \frac{\text{the thickness of coating film after the development}}{\text{the thickness of coating film before the development}} \right) \times 100$$

Subsequently, the coating film was heated under nitrogen at 100° C. for 30 minutes, at 200° C. for 30 minutes, and then at 350° C. for 30 minutes to obtain a relief pattern of polyimide. The results obtained are shown in Table 2.

Each solution of photosensitive resin composition obtained in Examples 1 to 107 was coated on a glass substrate, dried, and then heated at 350° C. for 1 hour. The film thus obtained was peeled from the glass substrate and film characteristics after curing were evaluated by the methods described below. The results obtained are shown in Table 2.

(1) Tensile Strength

Measured by making the aforesaid film (thickness: 30 μm) into test pieces having a width of about 1 cm and a length of about 10 cm, and measuring (10 mm/min) S-S curve for five of the test pieces by means of a tensile tester.

(2) Weight Loss Initiation Temperature

Measured in the air at a heating rate of 10° C./min by means of a differential thermobalance by using 10 mg of the aforesaid film.

In addition, each solution of photosensitive resin composition was spin coated on a silicon wafer, formed into a cured film, and subjected to adhesive properties evaluation by the so-called cross-cut test. The cross-cut test comprises cutting the cured film with a cutter knife so as to form 100 squares (1 mm□; each 1 mm$^2$), peeling off them by use of the cellophane adhesive tape prescribed in JIS K5400, and expressing the adhesive properties in terms of the number of squares peeled off per the 100 squares. The adhesive properties evaluation was carried out by counting the number of squares peeled off in the cross-cut test after treating the cured film for 100 hours by a pressure cooker test (121° C., 2 atmospheres). The results obtained are shown in Table 2.

Comparative Synthetic Examples 55 to 59

In the same manner as in Synthetic Example 43 or Synthetic Example 1 for Comparative Synthetic Examples 55 and 56 or Comparative Synthetic Examples 57 to 59, respectively, polymers were obtained by using a tetracarboxylic acid dianhydride, a diamine, a solvent an isocyanato compound having at least one ethylenic unsaturated group and a hydroxy group having at least one ethylenic unsaturated group in blending amounts shown in Table 1. Each of the polymers thus obtained as PI-55 to PI-59, respectively, was solidified by adding 80 ml of ethanol, followed by stirring for 3 hours and slow pouring into 8 liters of water.

Comparative Examples 1 to 14

Each of the polymers obtained in Comparative Synthetic Examples was stirred together with each photoinitiator, each polymerizable unsaturated compound and the like listed in Table 3, whereby there were obtained homogeneous solutions of photosensitive resin composition which were used in Comparative Examples 1 to 17.

In the same manner as in Examples, each solution was coated on a silicon wafer to obtain a coating film.

Then, the surface of the coating film was covered with a pattern mask, and exposure, development, rinsing, etc. were conducted in the same manner as in Examples to obtain a relief pattern. The cured state of the relief was evaluated in terms of the yield of residual film thickness.

Subsequently, the coating film was heated under nitrogen at 100° C. for 30 minutes, at 200° C. for 30 minutes, and then at 350° C. for 30 minutes, and film characteristics after curing were evaluated in the same manner as in Examples. The results obtained are shown in Table 3.

The photosensitive resin composition and the photosensitive element using the same of this invention have a high solubility, and can give a final cured film having both high heat resistance and high flexibility on the surface of a substrate. Moreover, they are good in light-trnasmitting properties and hence can be formed into a thick film. In addition, a thick film patterns obtained by using them have small dielectric constant and hence are useful as interlaminar insualting materials.

TABLE 1

| Synthetic Example | Tetracarboxylic acid dianhydride | Diamine | Isocyanate compound containing at least one ethylenic unsaturated group | Solvent | polymer |
|---|---|---|---|---|---|
| Synthetic Example 2 | 2,2-Bis[4-(3,4-dicarboxyphenyl)-hexafluoropropane dianhydride (133.2 g) | 2,2-Bis[4-(4-aminophenoxy)phenyl]hexafluoropropane (155.4 g) | Isocyanatoethyl methacrylate (23.3 g) | N-Methyl-2-pyrrolidone (720 g) | PI-2 |
| Synthetic Example 3 | 2,2-Bis(3,4-dicarboxyphenyl)-hexafluoropropane dianhydride (133.2 g) | 2,2-Bis(4-aminophenyl)hexafluoropropane (100.2 g) | Isocyanatoethyl methacrylate (23.3 g) | N-Methyl-2-pyrrolidone (590 g) | PI-3 |
| Synthetic Example 4 | 3,3',4,4'-Benzophenonetetracarboxylic dianhydride (96.6 g) | 2,2-Bis[4-(4-aminophenoxy)phenyl]hexafluoropropane (155.4 g) | Isocyanatoethyl methacrylate (23.3 g) | N-Methyl-2-pyrrolidone (615 g) | PI-4 |
| Synthetic Example 5 | 3,3',4,4'-Benzophenonetetracarboxylic dianhydride (48.3 g) 2,2-Bis[3-(3,4-dicarboxyphenyl)-hexafluoropropane dianhydride (66.6 g) | 2,2-Bis(4-aminophenyl)hexafluoropropane (100.2 g) | TD-HEA (43.5 g) | N-Methyl-2-pyrrolidone (600 g) | PI-5 |
| Synthetic Example 6 | 3,3',4,4'-Benzophenonetetracarboxylic dianhydride (48.3 g) | 2,2-Bis-(3-amino-4-methylphenyl)hexafluoropropane (108.6 g) | TD-HEA (43.5 g) | N-Methyl-2-pyrrolidone (575 g) | PI-6 |
| Synthetic Example 7 | 3,3',4,4'-Biphenyltetracarboxylic dianhydride (88.2 g) | 2,2-Bis(3-amino-4-methylphenyl)hexafluoropropane (54.3 g) 4,4'-Diaminodiphenyl ether (30.1 g) | Isocyanatoethyl methacrylate (23.3 g) | N-Methyl-2-pyrrolidone (510 g) | PI-7 |
| Synthetic Example 8 | 2,2-Bis[4-(3,4-dicarboxyphenoxy)phenyl]hexafluoropropane dianhydride (188.4 g) | 4,4'-Diamino-diphenyl ether (60.1 g) | Isocyanatoethyl methacrylate (23.3 g) | N-Methyl-2-pyrrolidone (630 g) | PI-8 |
| Synthetic Example 9 | 2,2-Bis[4-(3,4-dicarboxyphenoxy)phenyl]hexafluoropropane dianhydride (188.4 g) | p-Phenylenediamine (32.4 g) | Isocyanatoethyl methacrylate (23.3 g) | N-Methyl-2-pyrrolidone (560 g) | PI-9 |
| Synthetic Example 10 | 2,2-Bis[3-(3,4-dicarboxyphenyl)hexafluoropropane dianhydride (66.6 g) m-Terphenyl-3,3',4,4'-tetracarboxylic dianhydride (55.5 g) | 2,2-Bis[4-(4-aminophenoxy)phenyl]hexafluoropropane (155.4 g) | TD-HEA (23.3 g) | N-Methyl-2-pyrrolidone (640 g) | PI-10 |
| Synthetic Example 11 | 2,2-Bis(3,4-dicarboxyphenyl)-hexafluoropropane dianhydride (133.2 g) | 4,4'-Diaminodiphenyl ether (60.1 g) | Isocyanatoethyl methacrylate (23.3 g) | N-Methyl-2-pyrrolidone (560 g) | PI-11 |
| Synthetic Example 12 | 2,2-Bis(3,4-dicarboxyphenyl)-hexafluoropropane dianhydride (133.2 g) | 2,2-Bis[4-(4-aminophenoxy)phenyl]hexafluoropropane (155.4 g) | Isocyanatoethyl methacrylate (23.3 g) | N-Methyl-2-pyrrolidone (780 g) | PI-12 |
| Synthetic Example 13 | 2,2-Bis(3,4-dicarboxyphenyl)-hexafluoropropane dianhydride (133.2 g) | 4,4'-Diaminodiphenyl ether (30.05 g) 2,2-Bis[4-(4-aminophenoxy)phenyl]hexafluoropropane | Isocyanato compound TD-HEA (43.5 g) | N-Methyl-2-pyrrolidone (763 g) | PI-13 |

TABLE 1-continued

| | Dianhydride | Diamine | Isocyanate | Solvent | PI |
|---|---|---|---|---|---|
| Synthetic Example 14 | 2,2-Bis(2,3-dicarboxyphenyl)-hexafluoropropane dianhydride (133.2 g) | 4,4'-Diaminodiphenyl ether (77.7 g) 4,4'-Diaminodiphenyl ether (60.1 g) | Isocyanatoethyl methacrylate (23.3 g) | N-Methyl-2-pyrrolidone (560 g) | PI-14 |
| Synthetic Example 15 | 2,2-Bis(3,4-dicarboxyphenyl)-hexafluoropropane dianhydride (133.2 g) | 4,4'-Diaminodiphenylether-3-carbonamide (72.9 g) | Isocyanatoethyl methacrylate (23.3 g) | N-Methyl-2-pyrrolidone (585 g) | PI-15 |
| Synthetic Example 16 | 3,3',4,4'-Benzophenonetetracarboxylic dianhydride (96.6 g) | 2,2-Bis(4-aminophenyl)hexafluoropropane (100.2 g) | TD-HEA (43.5 g) | N-Methyl-2-pyrrolidone (660 g) | PI-16 |
| Synthetic Example 17 | 3,3',4,4'-Biphenyltetracarboxylic dianhydride (88.2 g) | 2,2-Bis(4-aminophenyl)hexafluoropropane (100.2 g) | Isocyanatoethyl methacrylate (23.3 g) | N-Methyl-2-pyrrolidone (540 g) | PI-17 |
| Synthetic Example 18 | m-Terphenyl-3,3'',4,4''-tetracarboxylic dianhydride (111.0 g) | 2,2-Bis(3-amino-4-methylphenyl)hexafluoropropane (108.6 g) | Isocyanatoethyl methacrylate (23.3 g) | N-Methyl-2-pyrrolidone (620 g) | PI-18 |
| Synthetic Example 19 | 3,3',4,4'-Benzophenonetetracarboxylic dianhydride (96.6 g) | 2,2-Bis(4-aminophenyl)hexafluoropropane (50.1 g) 4,4'-Diaminodiphenyl ether (30.0 g) | Isocyanatoethyl methacrylate (23.3 g) | N-Methyl-2-pyrrolidone (500 g) | PI-19 |
| Synthetic Example 20 | 3,3',4,4'-Benzophenonetetracarboxylic dianhydride (96.6 g) | 2,2-Bis[4-(4-aminophenoxy)phenyl]hexafluoropropane (155.4 g) | TD-HEA (43.5 g) | N-Methyl-2-pyrrolidone (680 g) | PI-20 |
| Synthetic Example 21 | 3,3',4,4'-Benzophenonetetracarboxylic dianhydride (48.3 g) 2,2-Bis(3,4-dicarboxyphenyl)hexafluoropropane dianhydride (66.6 g) | 2,2-Bis[4-(4-aminophenylthio)-phenyl]hexafluoropropane (165 g) | Isocyanatoethyl methacrylate (23.3 g) | N-Methyl-2-pyrrolidone (660 g) | PI-21 |
| Synthetic Example 22 | 3,3',4,4'-Biphenyltetracarboxylic dianhydride (88.2 g) | 2,2-Bis[4-(4-aminophenoxy)phenyl]hexafluoropropane (82.5 g) 4,4'-Diaminodiphenyl ether (30.1 g) | TD-HEA (43.5 g) | N-Methyl-2-pyrrolidone (680 g) | PI-22 |
| Synthetic Example 23 | Pyromellitic dianhydride (65.4 g) | 2,2-Bis[4-(3,5-dimethyl-4-aminophenoxy)phenyl]hexafluoropropane (172.2 g) | TD-HEA (43.5 g) | N-Methyl-2-pyrrolidone (650 g) | PI-23 |
| Synthetic Example 24 | 3,3',4,4'-Benzophenonetetracarboxylic dianhydride (96.6 g) | 2,2-Bis[4-(3,5-dimethyl-4-aminophenoxy)phenyl]hexafluoropropane (172.2 g) | Isocyanatoethyl methacrylate (23.3 g) | N-Methyl-2-pyrrolidone (670 g) | PI-24 |
| Synthetic Example 25 | 3,3',4,4'-Benzophenonetetracarboxylic dianhydride (96.6 g) | 2,2-Bis[4-(4-aminophenoxy)phenyl]hexafluoropropane (46.5 g) 4,4'-Diaminodiphenyl ether (42.0 g) | Methacryloyl isocyanate (16.7 g) | N-Methyl-2-pyrrolidone (403 g) | PI-25 |
| Synthetic Example 26 | 3,3',4,4'-Biphenyltetracarboxylic dianhydride (88.2 g) | 2,2-Bis[4-(4-aminophenoxy)phenyl]hexafluoropropane (123.0 g) | Methacryloyl isocyanate (16.7 g) | N-Methyl-2-pyrrolidone (403 g) | PI-26 |
| Synthetic Example 27 | 2,2-Bis(3,4-dicarboxyphenyl)-hexafluoropropane dianhydride | 4,4'-Diaminodiphenyl ether (40.0 g) | Isocyanatoethyl methacrylate | | PI-27 |

TABLE 1-continued

| | | | | | |
|---|---|---|---|---|---|
| 27 | 1,3-Bis(3,4-dicarboxyphenyl)-1,1,3,3-tetramethyldisiloxane dianhydride (21.3 g) 3,3',4,4'-Benzophenonetetracarboxylic dianhydride (32.2 g) | (22.2 g) | (15.5 g) | N-Methyl-2-pyrrolidone (250 ml) | |
| Synthetic Example 28 | 2,2-Bis(3,4-dicarboxyphenyl)-hexafluoropropane dianhydride (22.2 g) 1,3-Bis(3,4-dicarboxyphenyl)-1,1,3,3-tetramethyldisiloxane dianhydride (21.3 g) 3,3',4,4'-Benzophenonetetracarboxylic dianhydride (32.2 g) | 4,4'-diaminodiphenyl ether (40.0 g) |  (29.0 g) | N-Methyl-2-pyrrolidone (250 ml) | PI-28 |
| Synthetic Example 29 | 2,2-Bis(3,4-dicarboxyphenyl)-hexafluoropropane dianhydride (22.2 g) 1,3-Bis(3,4-dicarboxyphenyl)-1,1,3,3-tetramethyldisiloxane dianhydride (21.3 g) 3,3',4,4'-Benzophenonetetracarboxylic dianhydride (32.2 g) | 2,2-Bis(4-aminophenyl)-hexafluoropropane (20.0 g) | Isocyanatoethyl methacrylate (15.5 g) | N-Methyl-2-pyrrolidone (250 ml) | PI-29 |
| Synthetic Example 30 | 3,3',4,4'-Benzophenonetetracarboxylic dianhydride (32.2 g) | 2,2-Bis(4-aminophenyl)hexafluoropropane (10.0 g) 1,3-Bis(3-aminophenyl)-1,1,3,3-tetramethyldisiloxane (6.6 g) 4,4'0-Diaminodiphenyl ether (10.0 g) | Isocyanatoethyl methacrylate (7.7 g) | N-Methyl-2-pyrrolidone (250 ml) | PI-30 |
| Synthetic Example 31 | 3,3',4,4'-Benzophenonetetracarboxylic dianhydride (32.2 g) | 2,2-Bis[4-(4-aminophenoxy)phenyl]hexafluoropropane (15.5 g) 1,3-Bis(3-aminophenyl)-1,1,3,3-tetramethyldisiloxane (6.6 g) 4,4'-Diaminodiphenyl ether (10.0 g) | Isocyanatoethyl methacrylate (7.7 g) | N-Methyl-2-pyrrolidone (250 ml) | PI-31 |
| Synthetic Example 32 | 2,2-Bis(3,4-dicarboxyphenyl)-hexafluoropropane dianhydride (22.2 g) 3,3',4,4'-Benzophenonetetracarboxylic dianhydride (16.1 g) | 2,2-Bis(4-aminophenyl)hexafluoropropane (10.0 g) 1,1,3,3-tetramethyldisiloxane (6.6 g) 4,4'-Diaminodiphenyl ether | Isocyanatoethyl methacrylate (7.7 g) | N-Methyl-2-pyrrolidone (250 ml) | PI-32 |

TABLE 1-continued

| Synthetic Example 33 | 2,2-Bis(3,4-dicarboxyphenyl)-hexafluoropropane dianhydride (44.4 g) | 2,2-Bis(4-aminophenyl)hexafluoropropane (10.0 g) 1,3-Bis(4-aminophenyl)-1,1,3,3-tetramethyldisiloxane (6.6 g) 4,4'-Diaminodiphenyl ether (10.0 g) | Isocyanatoethyl methacrylate (7.7 g) | N-Methyl-2-pyrrolidone (250 ml) | PI-33 |
|---|---|---|---|---|---|
| Synthetic Example 34 | 2,2-Bis(3,4-dicarboxyphenyl)-hexafluoropropane dianhydride (13.3 g) 3,3',4,4'-Benzophenonetetra-carboxylic dianhydride (22.6 g) | 4,4'-Diaminodiphenyl ether (14.0 g) 1,3-Bis(4-aminophenyl)-1,1,3,3-tetramethyldisiloxane (9.9 g) | Isocyanatoethyl methacrylate (7.7 g) | N-Methyl-2-pyrrolidone (260 ml) | PI-34 |
| Synthetic Example 35 | 2,2-Bis(3,4-dicarboxyphenyl)-hexafluoropropane dianhydride (13.3 g) 3,3',4,4'-Benzophenonetetra-carboxylic dianhydride (22.6 g) | 4,4'-Diaminodiphenyl ether (14.0 g) 1,3-Bis(4-aminophenyl)-1,1,3,3-tetramethyldisiloxane (9.9 g) | 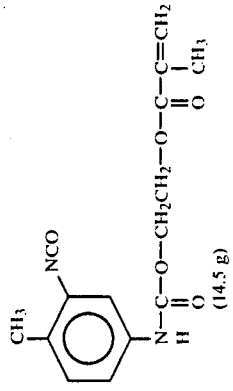 (14.5 g) | N-Methyl-2-pyrrolidone (260 ml) | PI-35 |
| Synthetic Example 36 | 1,3-Bis(3,4-dicarboxyphenyl)-1,1,3,3-tetramethyldisiloxane (12.8 g) 3,3',4,4'-Benzophenonetetra-carboxylic dianhydride (22.6 g) | 2,2-Bis(4-aminophenyl)hexafluoropropane (10.0 g) 4,4'-Diaminodiphenyl ether (14.0 g) | Isocyanatoethyl methacrylate (7.7 g) | N-Methyl-2-pyrrolidone (250 ml) | PI-36 |
| Synthetic Example 37 | 1,3-Bis(3,4-dicarboxyphenyl)-1,1,3,3-tetramethyldisiloxane (12.8 g) 3,3',4,4'-Benzophenonetetra-carboxylic dianhydride (22.6 g) | 2,2-Bis[4-(4-aminophenoxy)phenyl]hexafluoropropane (25.9 g) 4,4'-Diaminodiphenyl ether (10.0 g) | Isocyanatoethyl methacrylate (7.7 g) | N-Methyl-2-pyrrolidone (250 ml) | PI-37 |
| Synthetic Example 38 | 1,3-Bis(3,4-dicarboxyphenyl)-1,1,3,3-tetramethyldisiloxane (12.8 g) 3,3',4,4'-Benzophenonetetra-carboxylic dianhydride (22.6 g) | 2,2-Bis(4-aminophenyl)-hexafluoropropane (33.4 g) | Isocyanatoethyl methacrylate (7.7 g) | N-Methyl-2-pyrrolidone (250 ml) | PI-38 |

TABLE 1-continued

| | | | | | |
|---|---|---|---|---|---|
| Synthetic Example 39 | 3,3',4,4'-Benzophenonetetra-carboxylic dianhydride (128.88 g) | 4,4'-Diaminodiphenyl ether (40.05 g) 1,3-Bis(4-aminophenyl)-1,1,3,3-tetramethyldisiloxane (60.8 g) | 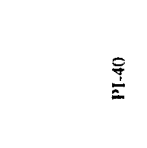 (58.0 g) | N,N-dimethyl-acetamide (500 ml) | PI-39 |
| Synthetic Example 40 | 3,3',4,4'-Benzophenonetetra-carboxylic dianhydride (128.88 g) | 4,4'-Diaminodiphenyl ether (40.05 g) 1,3-Bis(4-aminophenyl)-1,1,3,3-tetramethyldisiloxane (60.8 g) | Isocyanatoethyl methacrylate (31.0 g) | N,N-dimethyl-acetamide (500 ml) | PI-40 |
| Synthetic Example 41 | 3,3'-Benzophenonetetra-carboxylic dianhydride (64.44 g) 1,3-Bis(4-dicarboxyphenyl)-1,1,3,3-tetramethyldisiloxane dianhydride (85.2 g) | 4,4'-Diaminodiphenyl ether (80.1 g) | 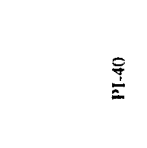 (58.0 g) | N,N-dimethyl-acetamide (500 ml) | PI-41 |
| Synthetic Example 42 | 3,3'-Benzophenonetetra-carboxylic dianhydride (64.44 g) 1,3-Bis(4-dicarboxyphenyl)-1,1,3,3-tetramethyldisiloxane dianhydride (85.2 g) | 4,4'-Diaminodiphenyl ether (80.1 g) | Isocyanatoethyl methacrylate (31.0 g) | N,N-Dimethyl-acetamide (500 ml) | PI-42 |
| Synthetic Example 44 | 2,2-Bis(3,4-dicarboxyphenyl)-hexafluoropropane dianhydride (20.7 g) 1,3-Bis(3,4-dicarboxyphenyl)-1,1,3,3-tetramethyldisiloxane dianhydride (25.6 g) m-Terphenyl-3,3'',4,4''-tetra-carboxylic dianhydride (37.0 g) | 4,4'-Diaminodiphenyl ether (40.0 g) | 2-Hydroxyethyl methacrylate (52.0 g) | N-Methyl-2-pyrrolidone (400 ml) | PI-44 |
| Synthetic Example 45 | 2,2-Bis(3,4-dicarboxyphenyl)-tetrafluoropropane dianhydride (20.7 g) 1,3-Bis(3,4-dicarboxyphenyl)-1,1,3,3-tetramethyldisiloxane dianhydride (25.6 g) | 2,2-Bis[4-(4-aminophenoxy)-phenyl]propane (82.1 g) | 2-Hydroxyethyl methacrylate (52.0 g) | N-Methyl-2-pyrrolidone (400 ml) | PI-45 |

TABLE 1-continued

| | | | | |
|---|---|---|---|---|
| Synthetic Example 46 | 3,3',4,4'-Biphenyltetra carboxylic dianhydride (29.4 g) 3,3',4,4'-Benzophenonetetra-carboxylic dianhydride (32.2 g) | 2,2-Bis(4-aminophenyl)hexa-fluoropropane (10.0 g) 1,3-Bis(4-aminophenyl)-1,1,3,3-tetramethyldisiloxane (6.6 g) 4,4'-Diaminodiphenyl ether (10.0 g) | 2-Hydroxyethyl methacrylate (26.0 g) | N-Methyl-2-pyrrolidone (200 ml) | PI-46 |
| Synthetic Example 47 | 3,3',4,4'-Biphenyltetra-carboxylic dianhydride (37.0 g) | 2,2-Bis(4-aminophenyl)hexa-fluoropropane (10.0 g) 1,3-Bis(4-aminophenyl)-1,1,3,3-tetramethyldisiloxane (6.6 g) 4,4'-Diaminodiphenyl ether (10.0 g) | 2-Hydroxyethyl methacrylate (26.0 g) | N-Methyl-2-pyrrolidone (200 ml) | PI-47 |
| Synthetic Example 48 | 3,3',4,4'-Benzophenonetetra-carboxylic dianhydride (32.2 g) | 2,2-Bis[4-(4-aminophenoxy)phenyl]hexafluoropropane (75.5 g) 1,3-Bis(4-aminophenyl)-1,1,3,3-tetramethyldisiloxane (6.6 g) 4,4'-Diaminodiphenyl ether (10.0 g) | 2-Hydroxyethyl methacrylate (26.0 g) | N-Methyl-2-pyrrolidone (200 ml) | PI-48 |
| Synthetic Example 49 | 2,2-Bis(3,4-dicarboxyphenyl)-hexafluoropropane dianhydride (13.3 g) 3,3',4,4'-Benzophenonetetra-carboxylic dianhydride (22.6 g) | 4,4'-Diaminodiphenyl ether (14.0 g) 1,3-Bis(4-aminophenyl)-1,1,3,3-tetramethyldisiloxane (9.9 g) | 2-Hydroxyethyl methacrylate (26.0 g) | N-Methyl-2-pyrrolidone (200 ml) | PI-49 |
| Synthetic Example 50 | 2,2-Bis(3,4-dicarboxyphenyl)-hexafluoropropane dianhydride (13.3 g) m-Terphenyl-3,3'',4,4''-tetra-carboxylic dianhydride (25.9 g) | 4,4'-Diaminodiphenyl ether (14.0 g) 1,3-Bis(4-aminophenyl)-1,1,3,3-tetramethyldisiloxane (9.9 g) | 2-Hydroxyethyl methacrylate (26.0 g) | N-Methyl-2-pyrrolidone (200 ml) | PI-50 |
| Synthetic Example 51 | 2,2-Bis(3,4-dicarboxyphenyl)-hexafluoropropane dianhydride (13.3 g) 3,3',4,4'-Benzophenonetetra-carboxylic dianhydride (22.6 g) | 2,2-Bis[4-(4-aminophenoxy)phenyl]propane (28.7 g) 1,3-Bis(4-aminophenyl)-1,1,3,3-tetramethyldisiloxane (9.9 g) | 2-Hydroxyethyl methacrylate (26.0 g) | N-Methyl-2-pyrrolidone (200 ml) | PI-51 |
| Synthetic Example 52 | 1,3-Bis(3,4-dicarboxyphenyl)-1,1,3,3-tetramethyldisiloxane (8.5 g) 3,3',4,4'-Benzophenonetetra-carboxylic dianhydride (25.7 g) | 4,4'-Diaminodiphenyl ether (14.0 g) 2,2-Bis(4-aminophenyl)-hexafluoropropane (10.0 g) | 2-Hydroxyethyl methacrylate (26.0 g) | N-Methyl-2-pyrrolidone (200 ml) | PI-52 |
| Synthetic Example 53 | 1,3-Bis(3,4-dicarboxyphenyl)-1,1,3,3-tetramethyldisiloxane | 4,4'-Diaminodiphenyl ether (14.0 g) | 2-Hydroxyethyl methacrylate | N-Methyl-2-pyrrolidone | PI-53 |

TABLE 1-continued

| | | Tetracarboxylic acid dianhydride | Diamine | Hydroxy compound containing at least one ethylenic unsaturated group/isocyanate compound containing at least one ethylenic unsaturated group | Solvent | polymer |
|---|---|---|---|---|---|---|
| | 53 | (8.5 g) m-Terphenyl-3,3'',4,4''-tetra-carboxylic dianhydride (29.6 g) | 2,2-Bis(4-aminophenyl)-hexa-fluoropropane (10.0 g) | (26.0 g) | (200 ml) | |
| Synthetic Example 54 | | 1,3-Bis(3,4-dicarboxyphenyl)-1,1,3,3-tetramethyldisiloxane dianhydride (8.5 g) 3,3',4,4'-Benzophenonetetra-carboxylic dianhydride (25.7 g) | 4,4'-Diaminodiphenyl ether (10.0 g) 2,2-Bis[4-(4-aminophenoxy)-phenyl]hexafluoropropane (25.9 g) | 2-Hydroxyethyl methacrylate (26.0 g) | N-methyl-2-pyrrolidone (200 ml) | PI-54 |
| Comp. Synthetic Example 55 | | Pyromellitic dianhydride (21.8 g) | 4,4'-Diaminodiphenyl ether (20.0 g) | 2-Hydroxyethyl methacrylate (26.0 g) | N-Methyl-2-pyrrolidone (202 ml) | PI-55 |
| Comp. Synthetic Example 56 | | 3,3',4,4'-Benzophenonetetra-carboxylic dianhydride (32.2 g) | 4,4'-Diaminodiphenyl ether (20.0 g) | 2-Hydroxyethyl methacrylate (26.0 g) | N-Methyl-2-pyrrolidone (202 ml) | PI-56 |
| Comp. Synthetic Example 57 | | Pyromellitic dianhydride (14.0 g) | p-Phenylenediamine (10.8 g) | Isocyanatoethyl methacrylate (15.5 g) | N-Methyl-2-pyrrolidone (250 ml) | PI-57 |
| Comp. Synthetic Example 58 | | 3,3',4,4'-Benzophenonetetra-carboxylic dianhydride (32.2 g) | 4,4'-Diaminodiphenyl ether (20.0 g) | Isocyanatoethyl methacrylate (15.5 g) | N-Methyl-2-pyrrolidone (250 ml) | PI-58 |
| Comp. Synthetic Example 59 | | 3,3',4,4'-Benzophenonetetra-carboxylic dianhydride (128.88 g) | 4,4'-Diaminodiphenyl ether (80.10 g) | Isocyanatoethyl methacrylate (31.0 g) | N,N-dimethyl-acetamide (500 ml) | PI-59 |

TABLE 2

| Example | Polymer | Photo-initiator/Assistant of photo-initiator | Polymerizable unsaturated compound | Thickness of coating film before development | Yield of residual film thickness | Weight Tensile strength | loss initiation temperature |
|---|---|---|---|---|---|---|---|
| Example 1 | PI-1 (100 g) | 2,4-Diethylthioxanthone (0.6 g)/ Ethyl p-dimethylaminobenzoate (0.9 g) | Ethylene glycol diacrylate (4.5 g) | 28 μm | 89% | 7.0 kgf/mm² | 400° C. |
| Example 2 | PI-1 (100 g) | 2,6-Bis(p-diethylaminobenzylidene)-4-methyl-4-azacyclohexane (0.15 g)/ N-(p-chlorophenyl)-glycine (1.5 g) | Hexanediol diacrylate (4.5 g) | 27 μm | 88% | 6.2 kgf/mm² | 405° C. |
| Example 3 | PI-2 (100 g) | 2,4-Diethylthioxanthone (0.6 g)/ Ethyl p-dimethylaminobenzoate (4.5 g) | Ethylene glycol diacrylate (4.5 g) | 31 μm | 85% | 7.1 kgf/mm² | 408° C. |
| Example 4 | PI-3 (100 g) | 2,4-Diethylthioxanthone (0.6 g)/ Ethyl p-dimethylaminobenzoate (0.9 g) | — | 30 μm | 80% | 6.5 kgf/mm² | 405° C. |
| Example 5 | PI-4 (100 g) | 2,6-Bis(p-diethylaminobenzylidene)-4-methyl-4-azacyclohexane (0.15 g)/ N-Phenyl-glycine (1.5 g) | Ethylene glycol diacrylate (4.5 g) | 29 μm | 83% | 5.7 kgf/mm² | 398° C. |
| Example 6 | PI-5 (100 g) | 2,6-Bis(p-diethylaminobenzylidene)-4-methyl-4-azacyclohexane (0.15 g)/ N-Phenyl-glycine (1.5 g) | Ethylene glycol diacrylate (4.5 g) | 31 μm | 88% | 5.5 kgf/mm² | 400° C. |
| Example 7 | PI-6 (100 g) | 2,4-Diethylthioxanthone (0.6 g)/ Isoamyl p-diethylaminobenzoate (0.9 g) | Hexanediol diacrylate (4.5 g) | 30 μm | 85% | 5.9 kgf/mm² | 395° C. |
| Example 8 | PI-7 (100 g) | 2,4-Diethylthioxanthone (0.6 g)/ Isoamyl p-diethylaminobenzoate (0.9 g) | Hexanediol diacrylate (4.5 g) | 28 μm | 83% | 5.8 kgf/mm² | 402° C. |
| Example 9 | PI-7 (100 g) | 2,6-Bis(p-diethylaminobenzylidene)-4-methyl-4-azacyclohexane (0.15 g)/ N-(p-chlorophenyl)-glycine (1.5 g) | Tetraethylene glycol diacrylate (4.5 g) | 30 μm | 88% | 6.5 kgf/mm² | 400° C. |
| Example 10 | PI-8 (100 g) | 2,6-Bis(p-diethylaminobenzylidene)-4-methyl-4-azacyclohexane (0.15 g)/ N-(p-chlorophenyl)-glycine (1.5 g) | Tetraethylene glycol diacrylate (4.5 g) | 28 μm | 86% | 7.0 kgf/mm² | 405° C. |
| Example 11 | PI-9 (100 g) | 2,6-Bis(p-diethylaminobenzylidene)-4-methyl-4-azacyclohexane (0.15 g)/ N-(p-chlorophenyl)-glycine (1.5 g) | Tetraethylene glycol diacrylate (4.5 g) | 29 μm | 83% | 7.3 kgf/mm² | 396° C. |
| Example 12 | PI-10 (100 g) | 1,4-Diethylthioxanthone (0.6 g)/ Isoamyl p-dimethylaminobenzoate (0.9 g) | A-BPE-10 (4.5 g) | 30 μm | 84% | 8.0 kgf/mm² | 402° C. |
| Example 13 | PI-10 (100 g) | 2,6-Bis(p-diethylaminobenzylidene)-4-methyl-4-azacyclohexane (0.15 g)/ N-(p-chlorophenyl)-glycine (1.5 g) | — | 30 μm | 85% | 6.9 kgf/mm² | 410° C. |

TABLE 2-continued

| | | | | | | | |
|---|---|---|---|---|---|---|---|
| Example 14 | PI-1 (100 g) | 2,4-Diethylthioxanthone (0.6 g)/ Ethyl p-dimethylaminobenzoate (0.9 g) | Ethylene glycol diacrylate (4.5 g) | 30 μm | 90% | 7.0 kgf/mm² | 400° C. |
| Example 15 | PI-1 (100 g) | 2,6-Bis(p-diethylaminobenzylidene)-4-methyl-4-azacyclohexanone (0.15 g)/ N-(p-Cyanophenyl)-glycine (1.5 g) | Hexanediol diacrylate (4.5 g) | 31 μm | 88% | 6.2 kgf/mm² | 405° C. |
| Example 16 | PI-1 (100 g) | 2,6-Bis(p-diethylaminobenzylidene)-4-methyl-4-azacyclohexanone (0.15 g)/ N-(p-Cyanophenyl)-glycine (1.5 g) | — | 29 μm | 80% | 5.9 kgf/mm² | 397° C. |
| Example 17 | PI-11 (100 g) | 2,4-Diethylthioxanthone (0.6 g)/ Ethyl p-dimethylaminobenzoate (0.9 g) | Ethylene glycol diacrylate (4.5 g) | 30 μm | 92% | 7.6 kgf/mm² | 395° C. |
| Example 18 | PI-11 (100 g) | 2,6-Bis(p-diethylaminobenzylidene)-4-methyl-4-azacyclohexanone (0.15 g)/ N-(p-Cyano-phenyl)-glycine (1.5 g) | — | 30 μm | 78% | 6.3 kgf/mm² | 398° C. |
| Example 19 | PI-11 (100 g) | 2,6-Bis(p-diethylaminobenzylidene)-4-methyl-4-azacyclohexanone (0.15 g)/ N-(p-Cyano-phenyl)-glycine (1.5 g) | A-BPE-10 (4.5 g) | 29 μm | 90% | 5.7 kgf/mm² | 403° C. |
| Example 20 | PI-12 (100 g) | 2,4-Diethylthioxanthone (0.6 g)/ Ethyl p-dimethylaminobenzoate (0.9 g) | Ethylene glycol diacrylate (4.5 g) | 31 μm | 85% | 7.1 kgf/mm² | 408° C. |
| Example 21 | PI-13 (100 g) | 2,4-Diethylthioxanthone (0.6 g)/ Ethyl p-dimethylaminobenzoate (0.9 g) | A-BPE-10 (4.5 g) | 32 μm | 90% | 6.5 kgf/mm² | 402° C. |
| Example 22 | PI-14 (100 g) | 2,4-Diethylthioxanthone (0.6 g)/ Ethyl p-dimethylaminobenzoate (0.9 g) | Ethylene glycol diacrylate (4.5 g) | 33 μm | 86% | 3.5 kgf/mm² | 386° C. |
| Example 23 | PI-15 (100 g) | 2,4-Diethylthioxanthone (0.6 g)/ Ethyl p-dimethylaminobenzoate (0.9 g) | Ethylene glycol diacrylate (4.5 g) | 30 μm | 90% | 6.1 kgf/mm² | 404° C. |
| Example 24 | PI-15 (100 g) | 2,6-Bis(p-diethylaminobenzylidene)-4-methyl-4-azacyclohexanone (0.15 g)/ N-(p-Cyanophenyl)-glycine (1.5 g) | Ethylene glycol diacrylate (4.5 g) | 31 μm | 84% | 5.8 kgf/mm² | 405° C. |
| Example 25 | PI-16 (100 g) | 2,4-Diethylthioxanthone (0.6 g)/ Ethyl p-dimethylaminobenzoate (0.9 g) | Ethylene glycol diacrylate (4.5 g) | 28 μm | 83% | 5.7 kgf/mm² | 401° C. |
| Example 26 | PI-16 (100 g) | 2,4-Diethylthioxanthone (0.6 g)/ Ethyl p-dimethylaminobenzoate (0.9 g) | Hexanediol diacrylate (4.5 g) | 27 μm | 90% | 5.5 kgf/mm² | 405° C. |
| Example 27 | PI-16 (100 g) | 2,6-Bis(p-diethylaminobenzylidene)-4-methyl-4-azacyclohexanone (0.15 g)/ N-(p-Chlorophenyl)-glycine (1.5 g) | — | 28 μm | 82% | 6.4 kgf/mm² | 397° C. |
| Example 28 | PI-17 (100 g) | 2,4-Diethylthioxanthone (0.6 g)/ Ethyl p-dimethylaminobenzoate (0.9 g) | Ethylene glycol diacrylate | 30 μm | 90% | 6.8 kgf/mm² | 395° C. |

TABLE 2-continued

| | | | | | | | |
|---|---|---|---|---|---|---|---|
| Example 29 | PI-17 (100 g) | 2,6-Bis(p-diethylaminobenzylidene)-4-methyl-4-azacyclohexanone (0.15 g)/ N-Phenyl glycine (1.5 g) | (4.5 g) | 31 μm | 84% | 6.2 kgf/mm² | 408° C. |
| Example 30 | PI-17 (100 g) | 2,6-Bis(p-diethylaminobenzylidene)-4-methyl-4-azacyclohexanone (0.15 g)/ N-Phenyl glycine (1.5 g) | A-BPE-10 (4.5 g) | 30 μm | 92% | 5.7 kgf/mm² | 410° C. |
| Example 31 | PI-18 (100 g) | 2,4-Diethylthioxanthone (0.6 g)/ Ethyl p-dimethylaminobenzoate (0.9 g) | Ethylene glycol diacrylate (4.5 g) | 29 μm | 84% | 3.3 kgf/mm² | 378° C. |
| Example 32 | PI-18 (100 g) | 2,4-Diethylthioxanthone (0.6 g)/ Ethyl p-dimethylaminobenzoate (0.9 g) | A-BPE-10 (4.5 g) | 27 μm | 86% | 3.2 kgf/mm² | 370° C. |
| Example 33 | PI-19 (100 g) | 2,4-Diethylthioxanthone (0.6 g)/ Ethyl p-dimethylaminobenzoate (0.9 g) | Ethylene glycol diacrylate (4.5 g) | 30 μm | 82% | 5.0 kgf/mm² | 405° C. |
| Example 34 | PI-5 (100 g) | 2,4-Diethylthioxanthone (0.6 g)/ Ethyl p-dimethylaminobenzoate (0.9 g) | Ethylene glycol diacrylate (4.5 g) | 29 μm | 84% | 5.1 kgf/mm² | 408° C. |
| Example 35 | PI-5 (100 g) | 2,6-Bis(p-diethylaminobenzylidene)-4-methyl-4-azacyclohexanone (0.15 g)/ N-(p-Cyanophenyl)-glycine (1.5 g) | Ethylene glycol diacrylate (4.5 g) | 31 μm | 88% | 5.5 kgf/mm² | 400° C. |
| Example 36 | PI-4 (100 g) | 2,4-Diethylthioxanthone (0.6 g)/ Ethyl p-dimethylaminobenzoate (0.9 g) | Ethylene glycol diacrylate (4.5 g) | 33 μm | 83% | 5.5 kgf/mm² | 400° C. |
| Example 37 | PI-4 (100 g) | 2,6-Bis(p-diethylaminobenzylidene)-4-methyl-4-azacyclohexanone (0.15 g)/ N-Phenyl glycine (1.5 g) | Ethylene glycol diacrylate (4.5 g) | 30 μm | 85% | 5.7 kgf/mm² | 398° C. |
| Example 38 | PI-4 (100 g) | 2,6-Bis(p-diethylaminobenzylidene)-4-methyl-4-azacyclohexanone (0.15 g)/ N-Phenyl glycine (1.5 g) | | 29 μm | 80% | 5.6 kgf/mm² | 395° C. |
| Example 39 | PI-20 (100 g) | 2,6-Bis(p-diethylaminobenzylidene)-4-methyl-4-azacyclohexanone (0.15 g)/ N-(p-Chlorophenyl)-glycine (1.5 g) | Hexanediol diacrylate (4.5 g) | 30 μm | 85% | 6.5 kgf/mm² | 405° C. |
| Example 40 | PI-20 (100 g) | 2,6-Bis(p-diethylaminobenzylidene)-4-methyl-4-azacyclohexanone (0.15 g)/ N-(p-Chlorophenyl)-glycine (1.5 g) | | 30 μm | 80% | 6.2 kgf/mm² | 403° C. |
| Example 41 | PI-20 (100 g) | 2,4-Diethylthioxanthone (0.6 g)/ Ethyl p-dimethylaminobenzoate (0.9 g) | Hexanediol diacrylate (4.5 g) | 32 μm | 87% | 5.9 kgf/mm² | 400° C. |
| Example 42 | PI-21 (100 g) | 2,4-Diethylthioxanthone (0.6 g)/ Ethyl p-dimethylaminobenzoate (0.9 g) | Hexanediol diacrylate (4.5 g) | 30 μm | 88% | 5.4 kgf/mm² | 410° C. |
| Example 43 | PI-21 (100 g) | 2,6-Bis(p-diethylaminobenzylidene)-4-methyl-4-azacyclohexanone (0.15 g)/ N-(p-Cyanophenyl)-glycine (1.5 g) | Ethyl glycol diacrylate (4.5 g) | 29 μm | 83% | 6.7 kgf/mm² | 404° C. |
| Example | PI-22 | 2,6-Bis(p-diethylaminobenzylidene)-4-methyl- | Ethylene | 29 μm | 84% | 5.5 | 405° C. |

TABLE 2-continued

| Example | Polymer | Photoinitiator/Assistant of photoinitiator | Polymerizable unsaturated compound | Thickness Yield of coating film before development | of residual film thickness | Weight Tensile strength | loss initiation temperature |
|---|---|---|---|---|---|---|---|
| Example 44 | | azacyclohexanone (0.15 g)/ N-Phenyl-glycine (1.5 g) | glycol diacrylate (4.5 g) | | | | |
| Example 45 | PI-23 (100 g) | 2,6-Bis(p-diethylaminobenzylidene)-4-methyl-4-azacyclohexanone (0.15 g)/ N-Phenylglycine (1.5 g) | Ethylene glycol diacrylate (4.5 g) | 30 μm | 90% | 5.7 kgf/mm² | 410° C. |
| Example 46 | PI-23 (100 g) | 2,4-Diethylthioxanthone (0.6 g)/ Ethyl p-dimethylaminobenzoate (0.9 g) | | 30 μm | 80% | 5.1 kgf/mm² | 402° C. |
| Example 47 | PI-24 (100 g) | 2,4-Diethylthioxanthone (0.6 g)/ Ethyl p-dimethylaminobenzoate (0.9 g) | | 29 μm | 82% | 5.8 kgf/mm² | 408° C. |
| Example 48 | PI-24 (100 g) | 2,6-Bis(p-diethylaminobenzylidene)-4-methyl-4-azacyclohexanone (0.15 g)/ N-Phenylglycine (1.5 g) | Ethylene glycol diacrylate | 31 μm | 80% | 6.1 kgf/mm² | 403° C. |
| Example 49 | PI-25 (100 g) | 2,6-Bis(p-diethylaminobenzylidene)-4-methyl-4-azacyclohexanone (0.2 g)/ N-(p-Cyanophenyl)-glycine (2.0 g) | | 35 μm | 81% | 5.1 kgf/mm² | 388° C. |
| Example 50 | PI-25 (100 g) | 2,4-Diethylthioxanthone (0.8 g)/ Ethyl N,N-diethylaminobenzoate (1.1 g) | | 33 μm | 90% | 7.1 kgf/mm² | 415° C. |
| Example 51 | PI-25 (100 g) | 2,4-Diethylthioxanthone (0.8 g)/ Isoamyl N,N-diethylaminobenzoate (1.2 g) | Tetraethylene glycol diacrylate (6.0 g) | 30 μm | 84% | 6.2 kgf/mm² | 395° C. |
| Example 52 | PI-26 (100 g) | 2,4-Diethylthioxanthone (0.8 g)/ Ethyl N,N-dimethylaminobenzoate (1.3 g) | | 30 μm | 80% | 6.4 kgf/mm² | 393° C. |
| Example 53 | PI-26 (100 g) | 2,6-Bis(p-diethylaminobenzylidene)-4-methyl-4-azacyclohexanone (0.15 g)/ N-(p-Cyano-phenyl)-glycine (2.2 g) | 2,2-Bis(4-acryloxypentaethoxyphenyl)-propane (6.5 g) | 35 μm | 84% | 6.8 kgf/mm² | 398° C. |
| Example 54 | PI-26 (100 g) | 2,6-Bis(p-diethylaminobenzylidene)-4-methyl-4-azacyclohexanone (0.2 g)/ N-(p-Cyanophenyl)-glycine (2.2 g) | Tetraethylene glycol diacrylate (6.0 g) | 40 μm | 80% | 6.1 kgf/mm² | 402° C. |
| Example 55 | PI-43 (10 g) | 2,4-Diethylthioxanthone (0.3 g)/ Ethyl N,N-diethylaminobenzoate (0.4 g) | Tetraethylene | Solvent N-Methyl-2-pyr- | 30 μm | 84% | 6.0 kgf/mm² | 410° C. |

TABLE 2-continued

| Example | Compound | Photoinitiator | Monomer | Solvent | Thickness | % | Strength | Temp |
|---|---|---|---|---|---|---|---|---|
| Example 56 | PI-43 (10 g) | 2,4-Diethylthioxanthone (0.3 g)/ Ethyl N,N-diethylaminobenzoate (0.4 g) | 1,6-Hexanediol diacrylate (1.6 g) | N-Methyl-2-pyrrolidone (23.5 g) | 28 μm | 85% | 5.2 kgf/mm² | 400° C. |
| Example 57 | PI-44 (10 g) | 2,4-Diethylthioxanthone (0.3 g)/ Ethyl N,N-diethylaminobenzoate (0.4 g) | 1,6-Hexanediol diacrylate (1.5 g) | N-Methyl-2-pyrrolidone (24 g) | 31 μm | 85% | 6.2 kgf/mm² | 415° C. |
| Example 58 | PI-44 (10 g) | 2,4-Diethylthioxanthone (0.3 g)/ Ethyl N,N-diethylaminobenzoate (0.4 g) | — | N-Methyl-2-pyrrolidone (25 g) | 29 μm | 83% | 5.7 kgf/mm² | 398° C. |
| Example 59 | PI-45 (10 g) | 2,6-Bis(p-diethylaminobenzylidene-4-methyl-4-azacyclohexanone (0.1 g)/ N-(p-cyanophenyl)-glycine (0.6 g) | Tetraethylene glycol dimethacrylate (1.7 g) | N-Methyl-2-pyrrolidone (25 g) | 28 μm | 85% | 5.6 kgf/mm² | 395° C. |
| Example 60 | PI-45 (10 g) | 2,6-Bis(p-diethylaminobenzylidene-4-methyl-4-azacyclohexanone (0.1 g)/ N-(p-cyanophenyl)-glycine (0.6 g) | Tetraethylene glycol diacrylate (1.6 g) | N-Methyl-2-pyrrolidone (24 g) | 30 μm | 82% | 6.4 kgf/mm² | 412° C. |
| Example 61 | PI-27 (10 g) | Benzophenone (0.1 g)/ Michler's ketone (0.1 g) | — | N-Methyl-2-pyrrolidone (24 g) | 30 μm | 88% | 5.5 kgf/mm² | 395° C. |
| Example 62 | PI-27 (10 g) | 2,4-Diethylthioxanthone (0.3 g)/ Isoamyl N,N-diethylaminobenzoate (0.4 g) | 1,6-Hexanediol diacrylate (1.5 g) | N-Methyl-2-pyrrolidone (24 g) | 29 μm | 85% | 6.0 kgf/mm² | 405° C. |
| Example 63 | PI-28 (10 g) | 2,4-Diethylthioxanthone (0.3 g)/ Isoamyl N,N-diethylaminobenzoate (0.4 g) | Tetraethylene glycol diacrylate (1.6 g) | N-Methyl-2-pyrrolidone (25 g) | 31 μm | 86% | 6.1 kgf/mm² | 410° C. |
| Example 64 | PI-28 (10 g) | 2,4-Diethylthioxanthone (0.3 g)/ Isoamyl N,N-diethylaminobenzoate (0.4 g) | — | N-Methyl-2-pyrrolidone (25 g) | 32 μm | 80% | 6.7 kgf/mm² | 400° C. |
| Example 65 | PI-29 (10 g) | 2,4-Diethylthioxanthone (0.3 g)/ Isoamyl N,N-diethylaminobenzoate (0.4 g) | Tetraethylene glycol diacrylate (1.7 g) | N-Methyl-2-pyrrolidone (25 g) | 30 μm | 82% | 6.5 kgf/mm² | 400° C. |
| Example 66 | PI-46 (10 g) | 2,4-Diethylthioxanthone (0.3 g)/ Ethyl N,N-diethylaminobenzoate (0.5 g) | Tetraethylene | N-Methyl-2-pyr- | 30 μm | 83% | 5.5 kgf/mm² | 410° C. |

TABLE 2-continued

| | | | | | | |
|---|---|---|---|---|---|---|
| Example 67 | PI-46 (10 g) | 2,4-Diethylthioxanthone (0.3 g)/ Ethyl N,N-diethylaminobenzoate (0.4 g) | glycol diacrylate (1.5 g) | N-Methyl-2-pyr-rolidone (24 g) | 32 μm | 85% | 5.9 kgf/mm² | 400° C. |
| Example 68 | PI-47 (10 g) | 2,4-Diethylthioxanthone (0.2 g)/ Ethyl N,N-diethylaminobenzoate (0.5 g) | Tetra-ethylene glycol diacrylate (1.6 g) | N-Methyl-2-pyr-rolidone (24 g) | 34 μm | 80% | 6.0 kgf/mm² | 398° C. |
| Example 69 | PI-47 (10 g) | 2,6-Bis(p-diethylaminobenzylidene)-4-methyl-4-azacyclohexanone (0.1 g)/ N-Phenyl-glycine (0.6 g) | — | N-Methyl-2-pyr-rolidone (24 g) | 30 μm | 86% | 6.3 kgf/mm² | 410° C. |
| Example 70 | PI-48 (10 g) | 2,6-Bis(p-diethylaminobenzylidene)-4-methyl-4-azacyclohexanone (0.1 g)/ N-(p-cyanophenyl)glycine (0.6 g) | Tetra-ethylene glycol dimeth-acrylate (1.5 g) | N-Methyl-pyrrolidone (24 g) | 29 μm | 88% | 6.1 kgf/mm² | 402° C. |
| Example 71 | PI-48 (10 g) | 2,6-Bis(p-diethylaminobenzylidene)-4-methyl-4-azacyclohexanone (0.1 g)/ N-(p-cyanophenyl)glycine (0.6 g) | 1,6-Hexane diol di-acrylate (1.0 g) | N-Methyl-2-pyr-rolidone (24 g) | 28 μm | 84% | 5.8 kgf/mm² | 395° C. |
| Example 72 | PI-30 (10 g) | Benzophenone (0.3 g)/ Michler's ketone (0.1 g) | — | N-Methyl-2-pyr-rolidone (24 g) | 32 μm | 80% | 6.4 kgf/mm² | 405° C. |
| Example 73 | PI-30 (10 g) | 2,4-Diethylthioxanthone (0.2 g)/ Isoamyl N,N-diethylaminobenzoate (0.4 g) | Tetra-ethylene glycol diacrylate (1.2 g) | N-Methyl-2-pyr-rolidone (24 g) | 30 μm | 83% | 5.4 kgf/mm² | 403° C. |
| Example 74 | PI-31 (10 g) | 2,4-Diethylthioxanthone (0.3 g)/ Isoamyl N,N-diethylaminobenzoate (0.5 g) | Tetra-ethylene glycol diacrylate (1.2 g) | N-Methyl-2-pyr-rolidone (24 g) | 28 μm | 87% | 6.0 kgf/mm² | 395° C. |
| Example 75 | PI-31 (10 g) | 2,4-Diethylthioxanthone (0.3 g)/ Isoamyl N,N-diethylaminobenzoate (0.5 g) | — | N-Methyl-2-pyr-rolidone (24 g) | 29 μm | 80% | 6.5 kgf/mm² | 400° C. |
| Example 76 | PI-32 (10 g) | 2,4-Diethylthioxanthone (0.3 g)/ Isoamyl N,N-diethylaminobenzoate (0.5 g) | 1,6-Hexane diol di-acrylate (1.6 g) | N-Methyl-2-pyr-rolidone (24 g) | 30 μm | 85% | 6.0 kgf/mm² | 405° C. |
| Example 77 | PI-33 (10 g) | 2,4-Diethylthioxanthone (0.3 g)/ Isoamyl N,N-diethylaminobenzoate (0.5 g) | 1,6-Hexane diol di- | N-Methyl-2-pyr-rolidone | 30 μm | 84% | 6.1 kgf/mm² | 410° C. |

TABLE 2-continued

| | | | | | | |
|---|---|---|---|---|---|---|
| Example 78 | PI-14 (10 g) | 2,6-Bis(p-diethylaminobenzylidene)-4-methyl-4-azacyclohexanone (0.1 g)/ N-(p-cyanophenyl)-glycine (0.6 g) | acrylate (1.5 g) Tetraethylene glycol diacrylate (1.4 g) | N-Methyl-2-pyrrolidone (25 g) (24 g) | 30 μm | 85% | 6.0 kgf/mm² | 402° C. |
| Example 79 | PI-49 (10 g) | 2,6-Bis(p-diethylaminobenzylidene)-4-methyl-4-azacyclohexanone (0.1 g)/ N-(p-cyanophenyl)-glycine (0.6 g) | Tetraethylene glycol dimethacrylate (1.2 g) | N-Methyl-2-pyrrolidone (24 g) | 29 μm | 86% | 6.0 kgf/mm² | 398° C. |
| Example 80 | PI-50 (10 g) | 2,6-Bis(p-diethylaminobenzylidene)-4-methyl-4-azacyclohexanone (0.1 g)/ N-(p-cyanophenyl)-glycine (0.6 g) | Tetraethylene glycol dimethacrylate (1.2 g) | N-Methyl-2-pyrrolidone (24 g) | 30 μm | 85% | 5.5 kgf/mm² | 400° C. |
| Example 81 | PI-50 (10 g) | 2,4-Diethylthioxanthone (0.3 g)/ Ethyl N,N-diethylaminobenzoate (0.5 g) | — | N-Methyl-2-pyrrolidone (24 g) | 31 μm | 78% | 5.6 kgf/mm² | 402° C. |
| Example 82 | PI-51 (10 g) | 2,4-Diethylthioxanthone (0.3 g)/ Ethyl N,N-diethylaminobenzoate (0.5 g) | Tetraethylene glycol diacrylate (1.0 g) | N-Methyl-2-pyrrolidone (24 g) | 30 μm | 87% | 6.2 kgf/mm² | 405° C. |
| Example 83 | PI-51 (10 g) | 2,4-Diethylthioxanthone (0.3 g)/ Ethyl N,N-diethylaminobenzoate (0.5 g) | — | N-Methyl-2-pyrrolidone (24 g) | 30 μm | 79% | 5.7 kgf/mm² | 410° C. |
| Example 84 | PI-34 (10 g) | Benzophenone (0.4 g)/ Michler's ketone (0.1 g) | 1,6-Hexanediol diacrylate (1.5 g) | N-Methyl-2-pyrrolidone (24 g) | 29 μm | 88% | 6.2 kgf/mm² | 396° C. |
| Example 85 | PI-34 (10 g) | 2,6-Bis(p-diethylaminobenzylidene)-4-methyl-4-azacyclohexanone (0.1 g)/ N-(p-cyanophenyl)-glycine (0.6 g) | — | N-methyl-2-pyrrolidone (24 g) | 31 μm | 80% | 5.6 kgf/mm² | 415° C. |
| Example 86 | PI-35 (10 g) | 2,6-Bis(p-diethylaminobenzylidene)-4-methyl-4-azacyclohexanone (0.1 g)/ N-(p-cyanophenyl)-glycine (0.6 g) | 1,6-Hexanediol diacrylate (1.0 g) | N-methyl-2-pyrrolidone (24 g) | 28 μm | 85% | 5.8 kgf/mm² | 394° C. |
| Example 87 | PI-35 (10 g) | 2,6-Bis(p-diethylaminobenzylidene)-4-methyl-4-azacyclohexanone (0.1 g)/ N-(p-cyanophenyl)-glycine (0.6 g) | Tetraethylene glycol diacrylate (0.9 g) | N-methyl-2-pyrrolidone (24 g) | 30 μm | 85% | 6.0 kgf/mm² | 398° C. |
| Example 88 | PI-52 (10 g) | 2,6-Bis(p-diethylaminobenzylidene)-4-methyl-4-azacyclohexanone (0.1 g)/ N-(p-cyanophenyl)glycine (0.6 g) | Tetraethylene glycol diacrylate | N-methyl-2-pyrrolidone (24 g) | 34 μm | 80% | 5.5 kgf/mm² | 398° C. |

TABLE 2-continued

| | Poly- | | Polymerizable unsaturated | | Thickness of coating film before development | Yield of residual film | Development | Tensile | Weight loss initiation temper- |
|---|---|---|---|---|---|---|---|---|---|
| Example 89 | PI-52 (10 g) | 2,6-Bis(p-diethylaminobenzylidene)-4-methyl-4-azacyclohexanone (0.1 g)/ N-(p-cyanophenyl)-glycine (0.6 g) | — | | N-methyl-2-pyr-rolidone (1.6 g) | 32 μm | 84% | 6.8 kgf/mm² | 400° C. |
| Example 90 | PI-53 (10 g) | 2,6-Bis(p-diethylaminobenzylidene)-4-methyl-4-azacyclohexanone (0.1 g)/ N-(p-cyanophenyl)-glycine (0.6 g) | Tetraethylene glycol diacrylate (1.7 g) | | N-methyl-2-pyr-rolidone (24 g) | 31 μm | 85% | 5.6 kgf/mm² | 395° C. |
| Example 91 | PI-53 (10 g) | 2,4-Diethylthioxanthone (0.3 g)/ Ethyl N,N-diethylaminobenzoate (0.5 g) | — | | N-methyl-2-pyr-rolidone (25 g) | 30 μm | 80% | 6.5 kgf/mm² | 405° C. |
| Example 92 | PI-54 (10 g) | 2,4-Diethylthioxanthone (0.3 g)/ Ethyl N,N-diethylaminobenzoate (0.5 g) | Tetraethylene glycol dimethacrylate (1.5 g) | | N-Methyl-2-pyr-rolidone (25 g) | 34 μm | 85% | 5.9 kgf/mm² | 400° C. |
| Example 93 | PI-54 (10 g) | 2,4-Diethylthioxanthone (0.3 g)/ Ethyl N,N-diethylaminobenzoate (0.5 g) | — | | N-methyl-2-pyr-rolidone (24 g) | 27 μm | 78% | 6.7 kgf/mm² | 403° C. |
| Example 94 | PI-36 (10 g) | Benzophenone (0.4 g)/ Michler's ketone (0.1 g) | Tetraethylene glycol dimethacrylate (1.6 g) | | N-Methyl-2-pyr-rolidone (24 g) | 30 μm | 86% | 5.6 kgf/mm² | 398° C. |
| Example 95 | PI-36 (10 g) | 2,6-Bis(p-diethylaminobenzylidene)-4-methyl-4-azacyclohexanone (0.1 g)/ N-(p-cyanophenyl)-glycine (0.6 g) | 1,6-Hexanediol diacrylate (1.5 g) | | N-Methyl-2-pyr-rolidone (24 g) | 30 μm | 84% | 5.4 kgf/mm² | 394° C. |
| Example 96 | PI-37 (10 g) | 2,6-Bis(p-diethylaminobenzylidene)-4-methyl-4-azacyclohexanone (0.1 g)/ N-(p-cyanophenyl)-glycine (0.6 g) | 1,6-Hexanediol diacrylate (1.5 g) | | N-Methyl-2-pyr-rolidone (24 g) | 30 μm | 85% | 6.0 kgf/mm² | 403° C. |
| Example 97 | PI-37 (10 g) | 2,6-Bis(p-diethylaminobenzylidene)-4-methyl-4-azacyclohexanone (0.1 g)/ N-(p-cyanophenyl)-glycine (0.6 g) | Tetraethylene glycol diacrylate (1.6 g) | | N-Methyl-2-pyr-rolidone (24 g) | 28 μm | 87% | 6.2 kgf/mm² | 405° C. |
| Example 98 | PI-38 (10 g) | 2,6-Bis(p-diethylaminobenzylidene)-4-methyl-4-azacyclohexanone (0.1 g)/ N-(p-cyanophenyl)-glycine (0.6 g) | Tetraethylene glycol diacrylate (1.5 g) | | N-Methyl-2-pyr-rolidone (24 g) | 30 μm | 85% | 6.0 kgf/mm² | 400° C. |

TABLE 2-continued

| ple | mer | Photoinitiator/Assistant of photoinitiator | compound | ment | thickness | time | strength | ature |
|---|---|---|---|---|---|---|---|---|
| Example 99 | PI-39 (100) | 2,6-Bis(p-diethylaminobenzylidene)-4-methyl-4-azacyclohexanone (0.18)/ N-(p-Cyanophenyl)-glycine (1.8) | Ethylene glycol dimeth- acrylate (7.1) | 28 μm | 80% | 90 sec | 5.9 kgf/mm² | 392° C. |
| Example 100 | PI-39 (100) | 2,6-Bis(p-diethylaminobenzylidene)-4-methyl-4-oxocyclohexanone (0.18)/ N-(p-Chlorophenyl)-glycine (1.8) | Tetra- ethylene glycol dimeth- acrylate (7.1) | 28 μm | 78% | 90 sec | 5.8 kgf/mm² | 395° C. |
| Example 101 | PI-30 (100) | 2,6-Bis(p-diethylaminobenzylidene)-4-methyl-4-oxocyclohexanone (0.18)/ N-Ethyl-N-(p-chlorophenyl)-glycine (1.8) | 2,2-Bis- (4-acryl- oxypenta- ethoxy- phenyl)- propane (7.1) | 30 μm | 82% | 100 sec | 6.3 kgf/mm² | 402° C. |
| Example 102 | PI-39 (100) | 2,6-Bis(p-dimethyl-aminobenzylidene) cyclopentanone (0.18)/ N-(p-Cyanophenyl)-glycine (1.8) | Tris(2- acryloyl- ethyl)- isocyanu- rate (7.1) | 29 μm | 79% | 95 sec | 6.4 kgf/mm² | 408° C. |
| Example 103 | PI-40 (100) | 2,6-Bis(p-dimethylaminobenzylidene) cyclopentanone (0.18)/ N-(p-Cyanophenyl)-glycine (1.8) | Ethylene glycol dimeth- acrylate (7.1) | 30 μm | 83% | 115 sec | 6.0 kgf/mm² | 396° C. |
| Example 104 | PI-40 (100) | 2,6-Bis(p-diethylaminobenzylidene)-4-oxocyclohexanone (0.18)/ N-Ethyl-N-(p-chlorophenyl)-glycine (1.8) | Tetra- ethylene glycol dimeth- acrylate (7.1) | 29 μm | 82% | 100 sec | 6.3 kgf/mm² | 395° C. |
| Example 105 | PI-40 (100) | 2,6-Bis(p-diethylaminobenzylidene)-4-methyl-4-azacyclohexanone (0.18)/ N-(p-Cyanophenyl)-glycine (1.8) | Tris(2- acryloyl- ethyl)- isocyanu- rate (7.1) | 28 μm | 84% | 90 sec | 6.7 kgf/mm² | 405° C. |
| Example 106 | PI-40 (100) | 2,6-Bis(p-dimethylaminobenzylidene) cyclopentanone (0.18)/ N-Ethyl-N-(p-chlorophenyl)-glycine (1.8) | 2,2-Bis(4- acryloxy- penta- ethoxy- phenyl)- propane (7.1) | 30 μm | 85% | 110 sec | 6.6 kgf/mm² | 410° C. |
| Example 107 | PI-41 (100) | 2,6-Bis(p-diethylaminobenzylidene)-4-methyl-4-azacyclohexanone (0.18)/ N-(p-Cyanophenyl)-glycine (1.8) | Ethylene glycol dimeth- acrylate (7.1) | 28 μm | 82% | 95 sec | 6.0 kgf/mm² | 390° C. |

TABLE 2-continued

| | | | | | | | |
|---|---|---|---|---|---|---|---|
| Example 108 | PI-41 (100) | 2,6-Bis(p-diethylaminobenzylidene)-4-methyl-4-azacyclohexanone (0.18)/ N-(p-cyclorophenyl)-glycine (1.8) | (7.1) Diethylene ethylene glycol dimethacrylate (7.1) | 28 μm | 80% | 95 sec | 6.0 kgf/mm² | 392° C. |
| Example 109 | PI-41 (100) | 2,6-Bis(p-diethylaminobenzylidene)-4-methyl-4-azacyclohexanone (0.18)/ N-(p-cyclorophenyl)-glycine (1.8) | 2,2-Bis(4-acryl-oxypenta-ethoxy-phenyl)-propane (7.1) | 29 μm | 83% | 95 sec | 6.2 kgf/mm² | 400° C. |
| Example 110 | PI-41 (100) | 2,6-Bis(p-dimethylaminobenzylidene)-cyclopentanone (0.18)/ N-Ethyl-N-(p-cyanophenyl)-glycine (1.8) | Tris(2-acryloyl-ethyl)isocyanurate (7.1) | 27 μm | 80% | 90 sec | 6.3 kgf/mm² | 405° C. |
| Example 111 | PI-42 (100) | 2,6-Bis(p-dimethylaminobenzylidene)-cyclopentanone (0.18)/ N-(p-cyanophenyl)-glycine (1.8) | Ethylene glycol dimethacrylate (7.1) | 29 μm | 84% | 100 sec | 6.1 kgf/mm² | 395° C. |
| Example 112 | PI-42 (100) | 2,6-Bis(p-dimethylaminobenzylidene)-4-phenylcyclohexanone (0.18)/ N-Ethyl-N-(p-chlorophenyl)-glycine (1.8) | Diethylene ethylene glycol dimethacrylate (7.1) | 28 μm | 85% | 90 sec | 6.2 kgf/mm² | 398° C. |
| Example 113 | PI-42 (100) | 2,6-Bis(p-diethylaminobenzylidene)-4-methyl-4-azacyclohexanone (0.18)/ N-(p-cyanophenyl)-glycine (1.8) | Tris(2-acryloyl-ethyl)isocyanurate (7.1) | 28 μm | 86% | 95 sec | 6.5 kgf/mm² | 410° C. |
| Example 114 | PI-42 (100) | 2,6-Bis(p-dimethylaminobenzylidene)-cyclopentanone (0.18)/ N-Ethyl-N-(p-chlorophenyl)-glycine (1.8) | 2,2-Bis(4-acryl-oxypenta-ethoxy-phenyl)-propane (7.1) | 30 μm | 85% | 105 sec | 6.4 kgf/mm² | 406° C. |

(the unit of the figures in parentheses: gram)
Note:

(1) A-BPE-10: 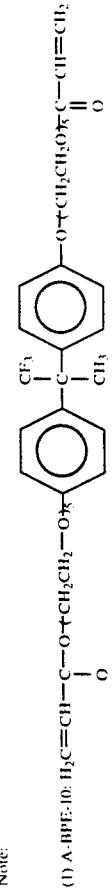

TABLE 3

| Comp. Example | Polymer | Photoinitiator/ Assistant of photoinitiator | Polymerizable unsaturated compound | Thickness of coating film before development | Yield of residual film thickness | Tensile strength | Weight loss initiation temperature |
|---|---|---|---|---|---|---|---|
| Comp. Example 1 | PI-59 (100 g) | 2,4-Diethylthioxanthone (0.6 g)/ Ethyl p-dimethylaminobenzoate (0.9 g) | A-BPE-10 (4.5 g) | 32 μm | 48% | 8.1 kgf/mm$^2$ | 405° C. |
| Comp. Example 2 | PI-59 (100 g) | 2,4-Diethylthioxanthone (0.6 g)/ Ethyl p-dimethylaminobenzoate (0.9 g) | — | 30 μm | 38% | 7.8 kgf/mm$^2$ | 413° C. |
| Comp. Example 3 | PI-59 (100 g) | 2,6-Bis(p-diethylaminobenzylidene)-4-methyl-4-azacyclohexanone (0.15 g)/ N-Phenylglycine (1.5 g) | Ethylene glycol diacrylate (4.5 g) | 33 μm | 50% | 8.0 kgf/mm$^2$ | 410° C. |
| Comp. Example 4 | PI-59 (100 g) | 2,4-Diethylthioxanthone (0.6 g)/ Ethyl p-dimethylaminobenzoate (0.9 g) | Ethylene glycol diacrylate (4.5 g) | 31 μm | 56% | 7.9 kgf/mm$^2$ | 410° C. |
| Comp. Example 5 | PI-59 (100 g) | 2,6-Bis(p-diethylamino benzylidene)-4-methyl-4-azacyclohexanone (0.15 g)/ N-(p-Cyano-phenyl)-glycine (1.5 g) | — | 32 μm | 48% | 7.7 kgf/mm$^2$ | 408° C. |
| Comp. Example 6 | PI-59 (100 g) | 2,6-Bis(p-diethylamino benzylidene)-4-methyl-4-azacyclohexanone (0.15 g)/ N-(p-Cyano-phenyl)-glycine (1.5 g) | Ethylene glycol diacrylate (4.5 g) | 33 μm | 50% | 8.0 kgf/mm$^2$ | 410° C. |

| Comp. Example | Polymer | Photoinitiator/ Assistant of photoinitiator | Polymerizable unsaturated compound | Solvent | Thickness of coating film before development | Yield of residual film thickness after development | Tensile strength | Weight loss initiation temperature |
|---|---|---|---|---|---|---|---|---|
| Comp. Example 8 | PI-55 (10 g) | 2,6-Bis(p-diethyl-aminobenzylidene)-4-methyl-4-azacyclohexanone (0.1 g)/ N-(p-Cyano-phenyl)glycine (0.6 g) | Tetraethylene glycol dimethacrylate (1.5 g) | N-Methyl-2-pyrrolidone (34 g) | 30 μm | 55% | 7.0 kgf/mm$^2$ | 415° C. |
| Comp. Example 9 | PI-56 (10 g) | 2,6-Bis(p-diethyl-aminobenzylidene)-4-methyl-4-azacyclohexanone (0.1 g)/ N-(p-Cyano-phenyl)glycine (0.6 g) | Tetraethylene glycol dimethacrylate (1.5 g) | N-Methyl-2-pyrrolidone (35 g) | 28 μm | 52% | 7.5 kgf/mm$^2$ | 409° C. |
| Comp. Example 10 | PI-57 (10 g) | 2,4-Diethyl-thioxanthone (0.3 g)/ Ethyl N,N-diethylaminobenzoate (0.5 g) | 1,6-Hexanediol diacrylate (1.6 g) | N-Methyl-2-pyrrolidone (36 g) | 28 μm | 48% | 6.8 kgf/mm$^2$ | 410° C. |
| Comp. Example 11 | PI-58 (10 g) | 2,4-Diethyl-thioxanthone (0.3 g)/ Ethyl N,N-diethylaminobenzoate (0.5 g) | 1,6-Hexanediol diacrylate (1.6 g) | N-Methyl-2-pyrrolidone (35 g) | 28 μm | 48% | 7.8 kgf/mm$^2$ | 420° C. |

| Comp. Example | Polymer | Photoinitiator/ Assistant of photoinitiator | Polymerizable unsaturated compound | Thickness of coating film before development | Yield of residual film thickness | Development time | Tensile strength | Weight loss initiation temperature |
|---|---|---|---|---|---|---|---|---|
| Comp. Example 12 | PI-59 (100) | 2,6-Bis(p-dimethylaminobenzylidene)-4-methyl-4-azacyclohexanone (0.18)/ N-Ethyl-N-(p-chlorophenyl)glycine (1.8) | Ethylene glycol dimethacrylate (7.1) | 28 μm | 45% | 215 sec | 7.8 kgf/mm$^2$ | 405° C. |
| Comp. Example 13 | PI-59 (100) | 2,6-Bis(p-diethylaminobenzylidene)-4-methyl-4-azacyclohexanone (0.18)/ N-Ethyl-N-(p-chlorophenyl)glycine (1.8) | Diethylene glycol dimethacrylate (7.1) | 29 μm | 43% | 210 sec | 7.5 kgf/mm$^2$ | 400° C. |
| Comp. Example 14 | PI-59 (100) | 2,6-Bis(p-dimethylaminobenzylidene)-cyclopentanone (0.18)/ N-Ethyl-N-(p-chloro- | 2,2-Bis(4-acryloxypenta-ethoxyphenyl)-propane (7.1) | 28 μm | 48% | 215 sec | 7.6 kgf/mm$^2$ | 410° C. |

TABLE 3-continued phenyl)glycine (1.8)

(the unit of the figures in parentheses: gram)
Note:

A-PBE-10: 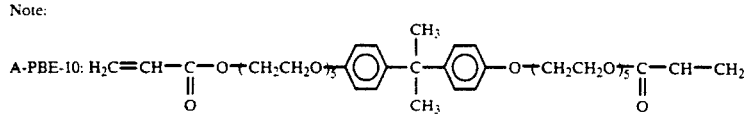

What is claimed is:

1. A photosensitive resin composition comprising
(A) a reaction mixture containing carboxyl groups obtained from
(a) a polymer containing repeating units of the formula:

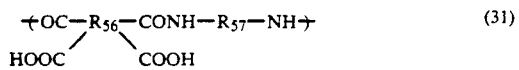 (31)

wherein $R_{57}$ is a divalent organic group; and $R_{56}$ is a silicon atom-containing tetravalent organic group of the formula:

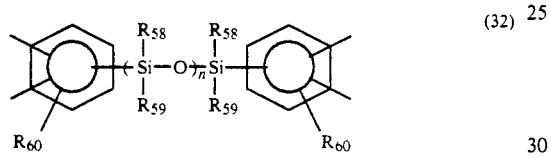 (32)

wherein $R_{58}$ and $R_{59}$ are independently a monovalent hydrocarbon group; $R_{60}$ is a hydrogen atom or a monovalent organic group; and n is an integer of 1 to 20, and (b) an isocyanato compound having at least one ethylenic unsaturated group, (B) a photoinitiator; and
(C) one or more polymerizable unsaturated compounds; said composition being able to be developed by using a developing solution containing (i) a polar solvent and a basic compound, (ii) a polar solvent, an organic solvent and a basic compound, (iii) a basic aqueous solution or (iv) a basic aqueous solution and an alcohol.

2. A photosensitive resin composition according to claim 1, wherein the polymer (a) further contains repeating units of the formula:

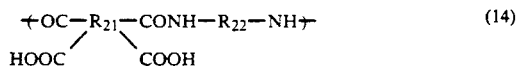 (14)

wherein $R_{21}$ is a tetravalent aromatic tetracarboxylic acid residue of the formula:

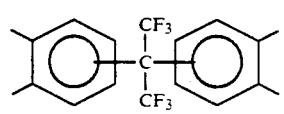 (24)

and $R_{22}$ is a divalent aromatic group.

3. A photosensitive resin composition according to claim 1, wherein the polymer (a) further contains repeating units of the formula:

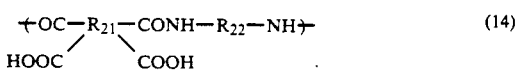 (14)

wherein $R_{21}$ is a tetravalent aromatic tetracarboxylic acid residue of the formula:

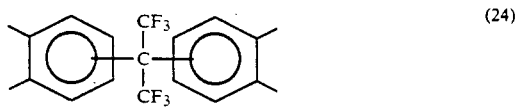 (24)

and $R_{22}$ is a divalent aromatic group, and repeating units comprising a residue of a tetracarboxylic acid dianhydride containing neither silicon atom nor fluorine atoms and a residue of a diamine of the formula $$H_2N-R_{15}-NH_2 \quad (9)$$

wherein $R_{15}$ is a divalent organic group.

4. A photosensitive resin composition according to claim 3, wherein the component (C) is 1,6-hexane glycol diacrylate, acrylic ester of tris(2-hydroxyethyl)-isocyanuric acid, a compound of the formula:

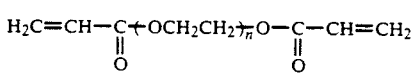

wherein n is an integer of 1 to 30, a compound of the formula:

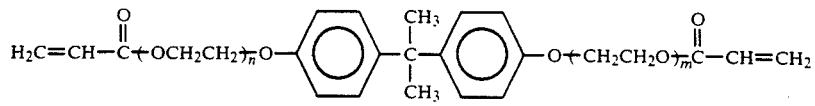

wherein n and m are independently integers and chosen so as to adjust n+m to 2-30, or a compound of the formula:

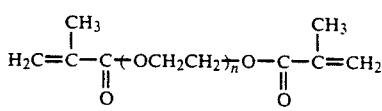

wherein n is an integer of 1 to 30.

5. A photosensitive element comprising a base material and a photosensitive resin composition of claim 14, laminated thereon.

6. A photosensitive element comprising a base material and a photosensitive resin composition of claim 3, laminated thereon.

7. A photosensitive resin composition according to claim 1, wherein the isocyanato compound (b) is a compound of the formula:

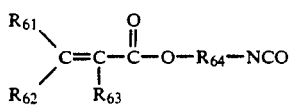  (33)

or

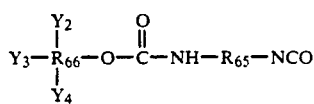  (34)

wherein $R_{61}$, $R_{62}$ and $R_{63}$ are independently a hydrogen atom or a methyl group; $R_{64}$ and $R_{65}$ are independently a divalent hydrocarbon group; $R_{66}$ is a tetravalent organic group; and $Y_2$, $Y_3$ and $Y_4$ are independently selected from the group consisting of hydrogen atom and monovalent organic groups having an ethylenic unsaturated group, at least one of $Y_2$, $Y_3$ and $Y_4$ being a monovalent organic group having an ethylenic unsaturated group.

8. A photosensitive resin composition according to claim 7, wherein in the formula (33) $R_{61}$ and $R_{62}$ are hydrogen atoms; $R_{63}$ is a methyl group; and $R_{64}$ is an ethylene group.

9. A photosensitive resin composition according to claim 1, wherein the polymer (a) further contains repeating units comprising a residue of a tetracarboxylic acid dianhydride containing neither silicon atom nor fluorine atom and a residue of a diamine of the formula:

$$H_2N-R_{15}-NH_2 \qquad (9)$$

wherein $R_{15}$ is a divalent organic group.

10. A photosensitive resin composition according to claim 9, wherein the isocyanato compound (b) is a compound of the formula:

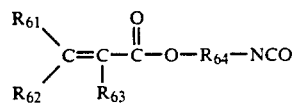  (33)

or

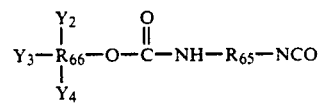  (34)

wherein $R_{61}$, $R_{62}$ and $R_{63}$ are independently a hydrogen atom or a methyl group; $R_{64}$ and $R_{65}$ are independently a divalent hydrocarbon group; $R_{66}$ is a tetravalent organic group; and $Y_2$, $Y_3$ and $Y_4$ are independently selected from the group consisting of hydrogen atom and monovalent organic groups having an ethylenic unsaturated group, at least one of $Y_2$, $Y_3$ and $Y_4$ being a monovalent organic group having an ethylenic unsaturated group.

11. A photosensitive element comprising a base material and a photosensitive resin composition of claim 10, laminated thereon.

12. A photosensitive resin composition according to claim 9, wherein the component (C) is 1,6-hexane glycol diacrylate, acrylic ester of tris(2-hydroxyethyl)-isocyanuric acid, a compound of the formula:

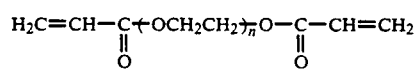

wherein n is an integer of 1 to 30, a compound of the formula:

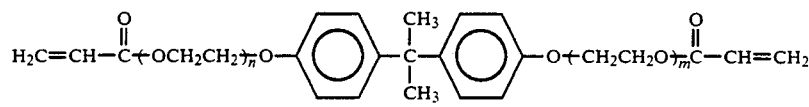

wherein n and m are independently integers and chosen so as to adjust n+m to 2-30, or a compound of the formula:

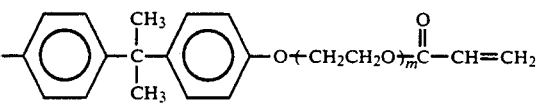

wherein n is an integer of 1 to 30.

13. A photosensitive element comprising a base material and a photosensitive resin composition of claim 12, laminated thereon.

14. A photosensitive resin composition according to claim 1, wherein the isocyanato compound (b) is a compound of the formula:

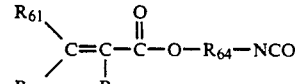  (33)

or

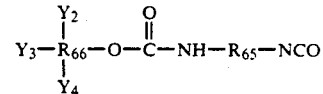  (34)

wherein $R_{61}$, $R_{62}$ and $R_{63}$ are independently a hydrogen atom or a methyl group; $R_{64}$ and $R_{65}$ are independently a divalent hydrocarbon group; $R_{66}$ is a tetravalent organic group; and $Y_2$, $Y_3$ and $Y_4$ are independently selected from the group consisting of hydrogen atom or monovalent organic groups having an ethylenic unsaturated group, at least one of $Y_2$, $Y_3$ and $Y_4$ being a monovalent organic group having an ethylenic unsaturated group.

15. A photosensitive element comprising a base material and a photosensitive resin composition of claim 4, laminated thereon.

16. A photosensitive element comprising a base material and a photosensitive resin composition of claim 1, laminated thereon.

* * * * *